United States Patent [19]
Kajiwara et al.

[11] Patent Number: 5,801,542
[45] Date of Patent: Sep. 1, 1998

[54] DISPLAY PANEL INSPECTION SOCKET

[75] Inventors: Yasushi Kajiwara; Michihiko Tezuka, both of Kawaguchi, Japan

[73] Assignee: Enplas Corporation, Saitama, Japan

[21] Appl. No.: 636,350

[22] Filed: Apr. 22, 1996

[30] Foreign Application Priority Data

| Apr. 20, 1995 | [JP] | Japan | 7-119402 |
| Jul. 6, 1995 | [JP] | Japan | 7-194170 |
| Jul. 6, 1995 | [JP] | Japan | 7-194171 |

[51] Int. Cl.$^6$ .................................................. G01R 31/02
[52] U.S. Cl. ........................................ 324/755; 324/770
[58] Field of Search ................................ 324/755, 770; 439/66, 67, 68, 69, 70; 359/54

[56] References Cited

U.S. PATENT DOCUMENTS

| 5,258,705 | 11/1993 | Okamoto et al. | 324/770 |
| 5,282,068 | 1/1994 | Inaba | 359/54 |
| 5,424,652 | 6/1995 | Hembree et al. | 324/755 |
| 5,440,240 | 8/1995 | Wood et al. | 324/755 |
| 5,453,701 | 9/1995 | Jensen et al. | 324/755 |
| 5,543,725 | 8/1996 | Lim et al. | 324/755 |

*Primary Examiner*—Ernest F. Karlsen
*Assistant Examiner*—Anh Phung
*Attorney, Agent, or Firm*—Fish & Richardson P.C.

[57] ABSTRACT

A display panel inspection socket has a socket body for holding a display panel having electrode terminals arranged on at least one side of the surface of an insulating base plate. Contacts are formed on contact films attached to the socket body. An elastic supporting member extends along a direction of arrangement of the electrode terminals and supporting the back surfaces of the contact films is attached to the socket body. A clip member is attached on the side of the socket body so as to grip the socket body and the insulating base plate of the display panel. When the clip member is moved from a releasing position to a pressing position, the back surface of the insulating base plate of the display panel is pressed by the clip member. This moves the electrode terminals of the display panel and the contacts on the contact films are electrically connected under a required contact pressure.

18 Claims, 30 Drawing Sheets

0

0.04

0.08

0.12

0.16

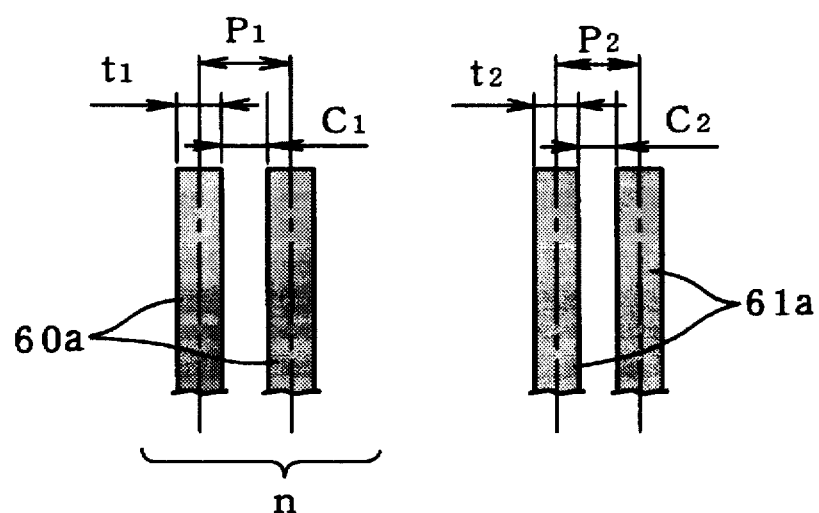

0

0.04

0.08

0.16

0.20

0.24

0.32 x=-0.04
y=-0.04 x=0
y=0 x=0.04
y=0

FIG.31A
FIG.31B
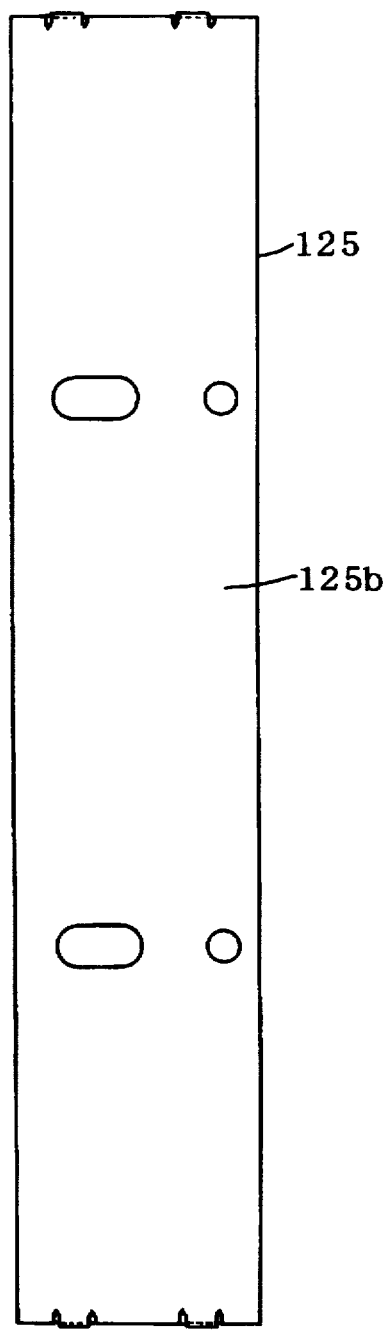
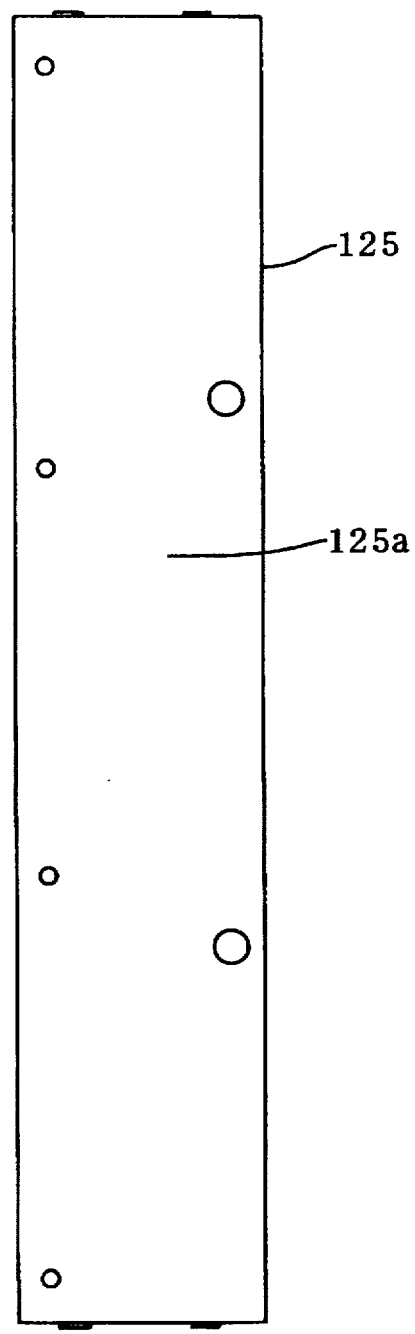
FIG.31C
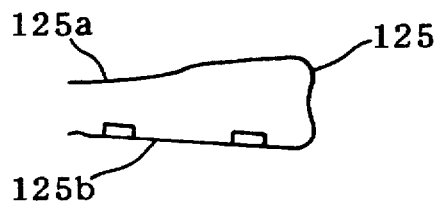

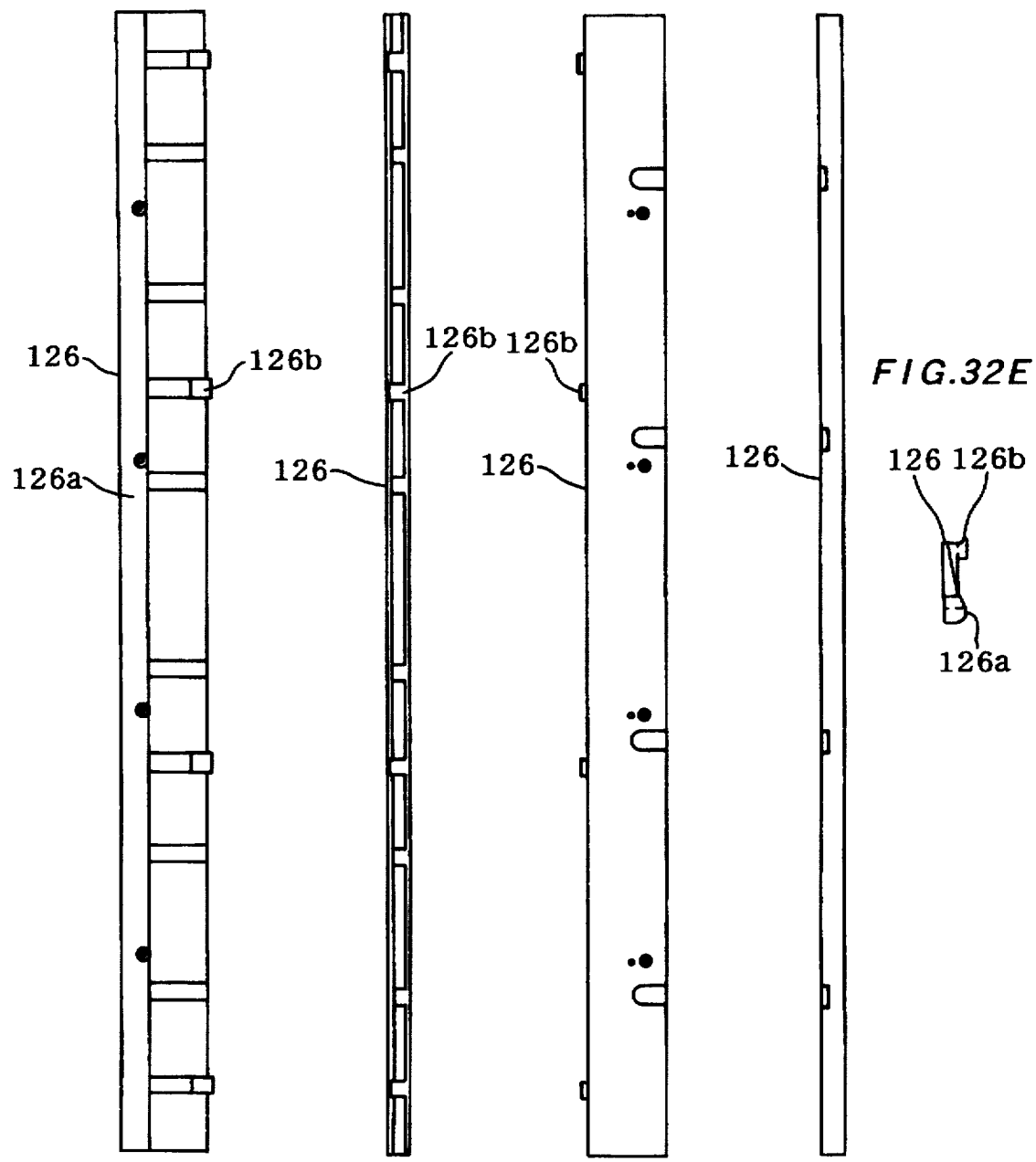

FIG.33A
FIG.33B
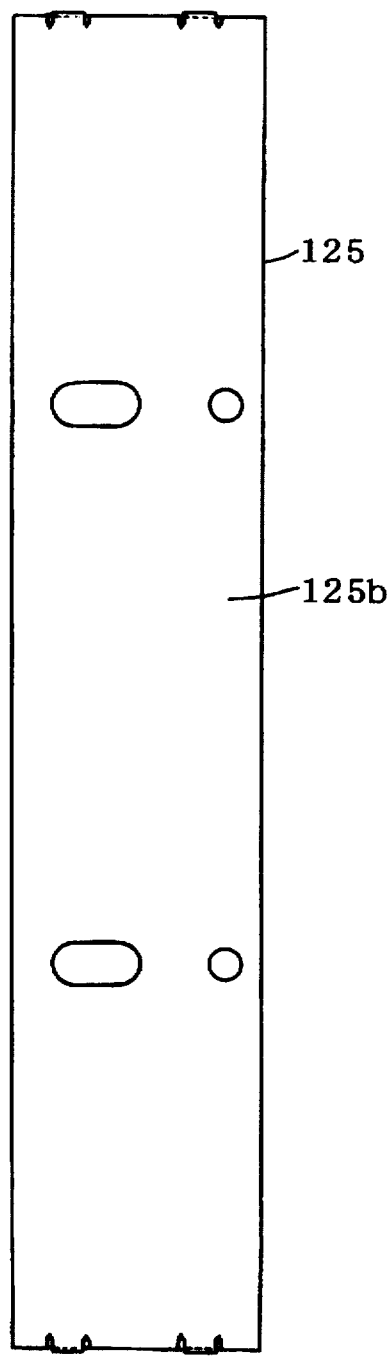
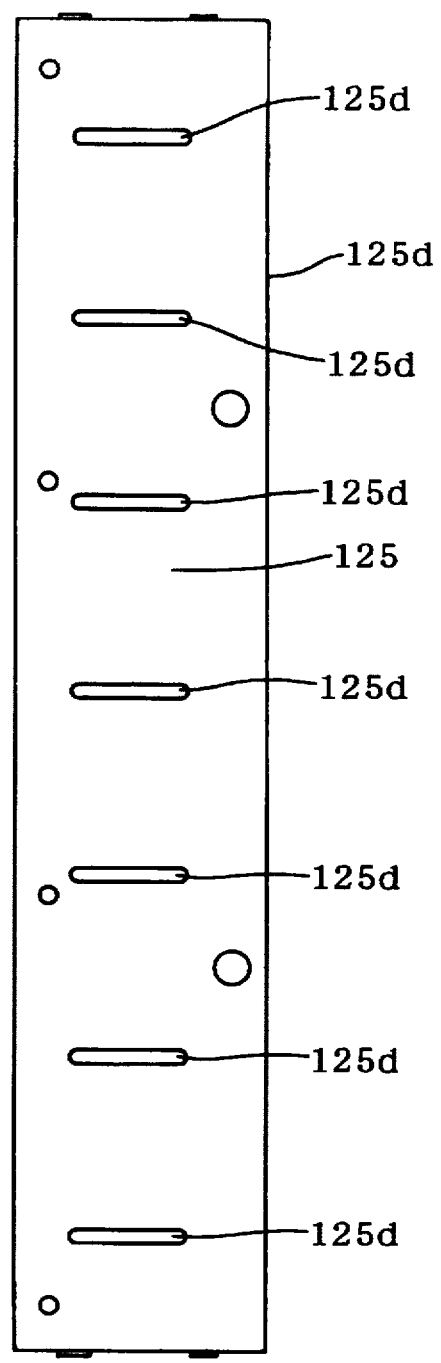
FIG.33C
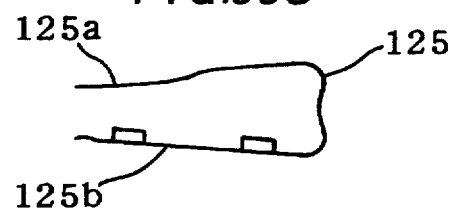

DISPLAY PANEL INSPECTION SOCKET

BACKGROUND OF THE INVENTION

1. Field of the Invention

The present invention relates to a display panel inspection socket which can be preferably used for inspection of the quality of the display etc. of a liquid crystal display panel, an electroluminescent panel, etc. (hereinafter referred to as "display panels").

2. Description of the Related Art

When inspecting the quality of the display or the like of a display panel before connection of the peripheral circuits, inspection of the display panel before the connection of the peripheral circuits requires use of a contact member for causing contact with the electrode terminals of the display panel and supplying a signal to the display panel. Further, when inspecting the display panel under a temperature environment different from the ordinary temperature such as in an aging test, desirably a plurality of display panels are simultaneously inspected.

As the contact member to be used for the inspection of the display panel, as indicated in for example Japanese Unexamined Patent Publication (Kokai) No. 6-308034, there have been known a wire probe and a contact film on the surface of which a pattern of contacts is formed. Where a contact film is used as the contact member, a pressing mechanism for bringing the contacts on the contact film into contact with the electrode terminals of the display panel under a uniform and sufficiently required contact pressure and in addition with a high positioning precision becomes necessary, but a display panel inspecting apparatus provided with such a pressing mechanism is enlarged in size under actual circumstances.

On the other hand, a connecting structure which grips a flexible cable and a printed circuit board by a clip having a schematically U-shaped cross-section serving as the pressing member is shown in Japanese Examined Utility Model Publication (Kokoku) No. 6-44038. Such a clip is preferred from the viewpoints of the reduction of weight and reduction of size of the pressing means, but since the clip is opened from the closed free state and directly attached to the side portion of the printed circuit board, the flexible cable and the printed circuit board are apt to deviate in position at the time of attachment of the clip. Accordingly, even if this connecting method is applied to the connecting structure of the electrode terminals of a display panel and the contacts of a contact film, it is difficult to secure a positioning precision between the electrode terminals and the contacts.

SUMMARY OF THE INVENTION

Accordingly, an object of the present invention is to provide a display panel inspection socket which is light weight and compact, can reliably perform the electrical connection with the display panel, and, in addition, is excellent in the efficiency of the attachment work of the display panel.

According to the present invention, there is provided a display panel inspection socket comprising a socket body for holding a display panel wherein a large number of electrode terminals are arranged at sides of the surface of an insulating base plate; contact films attached to the socket body and provided with contacts for contact with the electrode terminals of the display panel on the surface; elastic supporting members which are attached to the socket body and extend along a direction of arrangement of the electrode terminals of the display panel and support the back surfaces of the contact films; and clip members which are mounted on the sides of the socket body so as to grip the socket body and the insulating base plate of the display panel, one part of the clip members being able to slide between a pressing position for pressing the back surface of the insulating base plate of the display panel and a releasing position for releasing the display panel.

In the display panel inspection socket having the above configuration, the insulating base plate of the display panel is placed on the contact films on the socket body, then the clip members mounted on the socket body are slid from the releasing position to the pressing position, whereby a pressing force can be given to the back surface of the insulating base plate of the display panel and, therefore, the electrode terminals of the display panel can be brought into contact with the contacts of the contact films under a required contact pressure. Further, since the clip members are preliminarily mounted on the sides of the socket body, the clip members can be easily moved from the releasing position to the pressing position and, at the same time, the positional deviation between the electrode terminals of the display panel and the contacts of the contact films when the clip members are moved from the releasing position to the pressing position can be suppressed to the minimum level. Therefore, according to the present invention, a display panel inspection socket which is light in weight and compact, can reliably perform electrical connection with the display panel, and, in addition, is excellent in the efficiency of the attachment and detachment work of the display panel can be provided.

Preferably, supporting plates having guide surfaces which become substantially continuous with the back surface of the insulating base plate of the display panel are provided at the socket body. By this, the clip members can be more smoothly slid.

Preferably, protecting films to be interposed between the back surface of the insulating base plate of the display panel and one sides of the clip members are provided on the guide surfaces of the supporting plates. Accordingly, it is possible to reliably prevent the pressing force of the clip members in the sliding direction from being transferred to the insulating base plate of the display panel at the time of sliding motion of the clip members. Accordingly, the positional deviation between the electrode terminals of the display panel and the contacts of the contact films due to the positional deviation of the display panel can be more reliably prevented.

Preferably, the protecting films are formed so as to move from a position at which the front ends thereof cover the back surface of the insulating base plate of the display panel to a position for releasing the display panel when the clip members move from the pressing position to the releasing position. Accordingly, detachment of the display panel from the top of the socket body and the work of attaching the same to the socket body can be easily carried out without obstacle due to the protecting films.

Preferably, the contact films are attached to the socket body via film attachment plates attached to the socket body so that positional adjustment can be carried out along the direction of arrangement of the electrode terminals of the display panel. Accordingly, even if there is a slight variation in the position of arrangement of the electrode terminals of the display panel etc., the inspection of the quality of the display panel etc. can be correctly carried out by correctly positioning the contacts of the contact films.

Preferably, the film attachment plates have almost the same coefficient of linear expansion as that of the insulating base plate of the display panel. Accordingly, even if the temperature of the inspection environment of the display panel inspection socket on which the display panel is mounted is changed in an aging inspection etc., the changes in linear expansion of the sides of the film attachment plates and the insulating base plate of the display panel can be held almost the same. Accordingly, the positional deviation between the electrode terminals and the contacts due to changes in the temperature can be prevented, and therefore the quality of display of the display panel can be correctly inspected in a wide range of temperature environments.

Preferably, the display panel has source side electrode terminals and gate side electrode terminals; a plurality of contacts extending in parallel to the direction of arrangement of the source side electrode terminals are formed on the contact films for the source side electrode terminals among the contact films, and a plurality of contacts extending in parallel to the gate side electrode terminals are formed on the contact films for the gate side electrode terminals among the contact films; the contacts of the contact films for the gate side electrode terminals are connected to each other on one end side and the other end side of the contacts for every odd number column and every even number column; and insulating coating films for coating the mutual connecting regions of the contacts are formed on the contact films for the gate side electrode terminals.

According to the above configuration, since a plurality of contacts extending in parallel to the direction of arrangement of the source side electrode terminals of the display panel are formed on the contact films for the source side electrode terminals, the source side electrode terminals of the display panel and the contacts of the contact films for the source side electrode terminals can be reliably simultaneously brought into contact with each other. Accordingly, the same signal can be reliably simultaneously supplied to the source side electrode terminals of the display panel. Further, since a plurality of contacts are formed and arranged on the contact films for the gate side electrode terminals corresponding to the arrangement of the plurality of gate side electrode terminals of the display panel, the contacts of the odd number columns and the contacts of the even number columns are connected to each other on one end side and the other end side of the pattern, respectively, and further insulating coating films for coating the connecting regions of the contacts are formed on the contact films for the gate side electrode terminals, only the contacts of the odd number columns can be connected to the gate side electrode terminals of the odd number columns of the display panel, and only the contacts of the even number columns can be connected to the gate side electrode terminals of the even number columns, respectively. Accordingly, the same signal can be simultaneously supplied selectively with respect to the gate side electrode terminals of the odd number columns or the even number columns of the display panel.

Preferably, connecting portions for connecting the contacts of the respective columns are arranged on the contact films for the source side electrode terminals at intervals from each other along the direction of arrangement of the source side electrode terminals. Accordingly, no matter which source side electrode terminals the connecting portions between the columns of the contacts are located at positions in contact with, the source side electrode terminals can be further brought into contact with the contacts of the other columns. Accordingly, each source side electrode terminal can be reliably brought into contact with the contacts at a plurality of positions.

Preferably, the insulating base plate of the display panel is made of a transparent material; light shielding patterns having different pitches of arrangement from each other are formed on the insulating base plate and the contact films; and the light shielding patterns exhibit a moire stripe pattern #which shifts while changing in width# with respect to a change of the amount of the positional deviation between the electrode terminals and the contacts when the transparent insulating base plate and the contact films are superposed.

According to the above configuration, when the transparent insulating base plate of the display panel and the contact films are superposed, the moire stripe pattern appears according to the superposition of the light shielding pattern on the transparent insulating base plate and the light shielding pattern on the contact films. This moire stripe pattern is a pattern of bright and dark stripes having a cyclic pitch larger than the pitch of the light shielding patterns and moves while increasing in width with respect to the changes of the amount of positional deviation between the electrode terminals and the contacts, therefore the positional deviation between the electrode terminals and the contacts can be sufficiently easily confirmed even by the naked eye by observing the moire stripe pattern. Accordingly, by adjusting the position of the display panel or the contact films while observing the moire stripe pattern, the electrode terminals on the transparent insulating base plate of the display panel and the contacts on the contact films can be easily and reliably positioned. Further, if the change of this moire stripe pattern is detected by using an optical sensor etc., a high precision optical sensor and inspecting circuit become unnecessary and it becomes possible to reliably confirm the positional deviation between the electrode terminals and the contacts by a simple detecting device. Accordingly, the positioning between the electrode terminals of the display panel and the contacts formed and arranged on the contact films can be easily and quickly carried out.

Further, preferably, the insulating base plate of the display panel is made of a transparent material; light shielding patterns having a different pitch of arrangement from that of the electrode terminals are formed on the contact films; and the electrode terminals and the light shielding patterns exhibit a moire stripe pattern which shifts while changing in width with respect to the change of the amount of positional deviation between the electrode terminals and the contacts when the transparent insulating base plate and the contact films are superposed.

According to the above configuration, when the transparent insulating base plate of the display panel and the contact films are superposed, a moire stripe pattern appears by the superposition of the electrode terminals on the transparent insulating base plate and the light shielding patterns on the contact films. This moire stripe pattern is a pattern of bright and dark stripes having a cyclic pitch larger than the pitch of the light shielding patterns and moves while increasing in width with respect to a change of the amount of positional deviation between the electrode terminals and the contacts, therefore the positional deviation between the electrode terminals and the contacts can be sufficiently easily confirmed even by the naked eye by observing the moire stripe pattern. Accordingly, by adjusting the position of the display panel or the contact films while observing the moire stripe pattern, the electrode terminals on the transparent insulating base plate of the display panel and the contacts on the contact films can be easily and reliably positioned. Further, if the change of this moire stripe pattern is detected by using an optical sensor etc., a high precision optical sensor and inspecting circuit become unnecessary, and it becomes possible to reliably confirm the positional deviation between the electrode terminals and the contacts by a simple detecting device. Accordingly, the positioning between the electrode terminals of the display panel and the contacts formed and arranged on the contact films can be easily and quickly carried out.

Further preferably, the clip members can further retract from the releasing position to a retracting position on an opposite side to the pressing position; flexible shutters interposed between the clip members and the display panel when the clip members press the display panel are provided on the supporting plates; the shutters can move from an opening position at which the front ends thereof open the display panel mounting region by the biasing force of a spring means to a covering position at which the front ends cover the top of the display panel; fitting portions which are fitted with the engagement portions of the shutters when the one sides of the clip members retract from the pressing position to the releasing position are provided on the clip members; and the fitting portions move the shutters from the covering position to the opening position against the biasing force of the spring means when the clip members further retract from the releasing position to the retracting position.

According to the above configuration, when the clip members further retract from the releasing position, the fitting portions of the clip members move the shutters from the covering position to the opening position against the biasing force of the spring means, therefore it is possible to prevent the clip members and the shutters from obstructing the attachment and the detachment of the display panel when the display panel is attached and detached. Further, after the display panel is attached, when the clip members are moved from the retracting position to the pressing position, during the period when the clip members move from the retracting position to an intermediate releasing position, the shutters move from the opening position to the covering position at which the front ends thereof cover the top of the display panel by the biasing force of the spring means, therefore when the clip members moves from the opening position to the pressing position after this, the bottom surface of the front ends of the clip members start to move while sliding on the top surface of the shutters covering the display panel. Accordingly, the clip members do not come into direct contact with the top surface of the display panel, and therefore wear due to the clip members can be prevented from being caused on the top surface of the display panel. Further, the clip members perform a sliding motion by sliding on the top surface of the shutters at the covering position, therefore it is possible to prevent the display panel from being pushed and moved by the clip members in the same direction as the sliding direction thereof. Accordingly, the positional deviation between the electrode terminals of the display panel and the contacts on the contact films can be prevented. Further, the shutters can be moved to the outside of the display panel mounting region by their sliding motion, and it is not necessary to cause a large strain in the shutters, therefore the durability of the shutters is improved and, at the same time, there is no apprehension of unintentional deformation of the shutters at the time of attachment and detachment of the display panel.

Preferably, projecting guides which abut against the bottom surface of the front ends of the clip members and space the clip members away from the top surface of the contact films when the clip members move between the releasing position and the retracting position are provided on the supporting plates.

According to the above configuration, when the clip members move between the releasing position and the retracting position, the shutters move between the covering position and the opening position linked to the clip members, but during the movement of the shutters, the projecting guides provided on the supporting plates abuts against the bottom surface of the front ends of the clip members and space the clip members from the top surface of the contact films, therefore the shutters can be easily slid without causing the pressing force of the clip members to act upon the shutters.

Preferably, the top surfaces of the supporting plates have almost the same height as the top surfaces of the sides of the display panel at the front ends in close contact with the sides of the display panel to be mounted on the contact films and the top surfaces of the supporting plates are inclined downward more gently as they go from the vicinity of the front ends of the supporting plates toward the front ends.

According to the above configuration, since the top surfaces of the supporting plates have almost the same height as the top surfaces of the sides of the display panel at the front ends in close contact with the sides of the display panel on the contact films and the top surfaces of the supporting plates are inclined downward more gently as they go from the vicinity of the front ends of the supporting plates toward the front ends, when the clip members are moved forward from the releasing position to the pressing position, the clip members can be smoothly moved forward while pressing the top surface of the shutter covering the top surfaces of the supporting plates which are smoothly inclined downward and the top surfaces of the side portions of the display panel by the bottom surface of the front ends of the clip members.

Preferably, a lead pattern connected to the contacts is formed on the top surface of each contact film; the top surface of a flexible printed circuit board on the top surface of which a wiring pattern is formed is superposed on the bottom surface of the base end of each contact film; small holes are made in each contact film at the position where the lead pattern on each contact film and the wiring pattern on the flexible printed circuit board are superposed; and the lead pattern on each contact film and the wiring pattern on the flexible printed circuit board are electrically connected by an electrically conductive binder provided so as to fill the small holes.

According to the above configuration, even if the wiring of the lead pattern on each contact film is a complex wiring where for example one lead pattern is surrounded by other lead patterns, the lead pattern on each contact film and the wiring pattern on the flexible printed circuit board can be easily electrically connected. Further, each contact film and the flexible printed circuit board can be fixed by the electrically conductive binder for connecting the lead pattern and the wiring pattern, therefore the connecting step of each contact film and the flexible printed circuit board can be simplified.

Preferably, the clip member comprises a damper made of metal having a lateral U-shaped cross-section and having a spring property mounted on the socket body so as to vertically clip the socket body and the display panel and a sliding piece made of plastic which is attached to the bottom surface of the front end of an upper piece over almost the entire length of the upper piece of the damper and brought into sliding-contact with the top surface of the shutter.

In the above configuration, strain is easily caused in the damper made of metal having a lateral U-shaped cross-section when it is formed by pressing or the like, therefore undulation or warping is apt to occur along the direction of arrangement of the electrode terminals in the upper piece of the clamper. However, since a sliding piece made of plastic which easily secures a high dimensional precision is attached to the bottom surface of the front end of the upper piece over almost the entire length of the upper piece of the clamper, even if undulation or warping occurs in the upper piece of the clamper, this can be corrected. Further, even if undulation or warping slightly remains in the upper piece of the clamper, the linearity of the direction of arrangement of the electrode terminals can be easily secured by the sliding piece made of plastic, therefore the top surface of the display panel can be uniformly pressed by the sliding piece via the shutter. Accordingly, the reliability of the contact between the electrode terminals of the display panel and the contacts on the contact films can be enhanced.

Preferably, the clip member has a damper made of metal having a lateral U-shaped cross-section having a spring property mounted on the socket body so as to vertically grip the display panel and the socket body; and a slit extended in a direction orthogonal to the direction of arrangement of the electrode terminals of the display panel is formed in the clamper.

According to the above configuration, since a slit extending in a direction orthogonal to the direction of arrangement of the electrode terminals of the display panel is formed in the upper piece of the damper made of metal having a lateral U-shaped cross-section vertically gripping the socket body and the display panel, when the damper made of metal is formed by the bending of the metal plate, the strain of the upper piece of the damper can be absorbed by the slit and it is possible to effectively suppress undulation or warping along the direction of arrangement of the electrode terminals of the display panel from being generated in the upper piece of the clamper. Accordingly, when pressing the top surface of the display panel by the spring force of the damper via the flexible shutter, a uniform pressing force can be given along the direction of arrangement of the electrode terminals of the display panel, and therefore the respective electrode terminals of the display panel and the contacts of the contact films can be brought into contact with each other under a uniform contact pressure.

Preferably, in the display panel inspection sockethaving the above configuration, the slits are formed in the upper pieces of the dampers away from the front ends of the upper pieces of the clampers.

According to the above configuration, since a slit extending in the direction orthogonal to the direction of arrangement of the electrode terminals of the display panel is formed in the upper piece of the damper away from the front end of the upper piece of the clamper, the degree of parallelism between the upper piece of the damper and the top surface of the display panel can be secured. Further, the linearity of the front end of the upper piece can be easily secured more than a case where the front end of the upper piece of the damper is divided in the direction of arrangement of the electrode terminals of the display panel by the slit, therefore a more uniform pressing force can be given to the top surface of the display panel along the direction of arrangement of the electrode terminals of the display panel.

Preferably, the clip member further has a sliding piece made of plastic which is attached to the bottom surface of the front end of the upper piece of the damper and brought into sliding-contact with the top surface of the shutter.

According to this configuration, by attaching the sliding piece made of plastic to be brought into sliding contact with the top surface of the shutter to the bottom surface of the front end of the upper piece of the clamper, even if undulation or warping slightly remains in the upper piece of the clamper, the undulation or warping can be suppressed by the sliding piece. Further, the top surface of the display panel can be pressed via the shutter by the sliding piece made of plastic which can easily secure a processing precision by shaping etc., therefore a uniform pressing force can be more reliably given along the direction of arrangement of the electrode terminals of the display panel. Further, since the sliding piece made of plastic is brought into sliding contact with the top of the shutter, even if the shutter is made of metal, generation of metal powder caused by wear due to the sliding movement between metals can be prevented.

In place of the above configuration, it is also possible if the sliding contact portion which is brought into sliding contact with the top surface of the shutter is formed by bending downward the front end of the upper piece of the clamper; the shutter is made of a metal plate; and a coating of resin is applied to either of the top surface of the shutter or the sliding contact portion of the clamper. In this case, on the front end of the upper piece of the clamper, a sliding contact portion to be brought into sliding contact with the top surface of the shutter is formed by bending downward, the shutter is made of a metal plate, and a coating of resin is applied to either of the top surface of the shutter or the sliding contact portion of the clamper.

According to the above configuration, since the sliding contact portion to be brought into sliding contact with the top surface of the shutter is formed by bending downward the front end of the upper piece of the clamper made of metal, the generation of the undulation or warping in the upper piece of the clamper can be more effectively prevented and, at the same time, the number of parts of the clip member can be reduced. Further, since the coating of resin is applied to the top surface of the shutter made of metal or sliding contact portion of the clamper, the generation of metal powder due to wear caused by the sliding movement between the clamper made of metal and the shutter made of metal can be prevented.

BRIEF DESCRIPTION OF THE DRAWINGS

FIGS. 19A and 19B are explanatory views for explaining a method of designing the dimensions of the light shielding patterns shown in FIG. 18, respectively.

FIGS. 31A, 31B, and 31C are a bottom view, a plan view, and a side view of a clamper of the clip member, respectively.

FIGS. 32A, 32B, 32C, 32D, and 32E are a bottom view, a back view, a plan view, a front view, and a right side view of a sliding piece attached to the clamper of a clip member, respectively.

FIGS. 33A, 33B, and 33C are a bottom view, a plan view, and a side view showing a modification of the clamper of the clip member, respectively.

DESCRIPTION OF THE PREFERRED EMBODIMENTS

Figure 1:
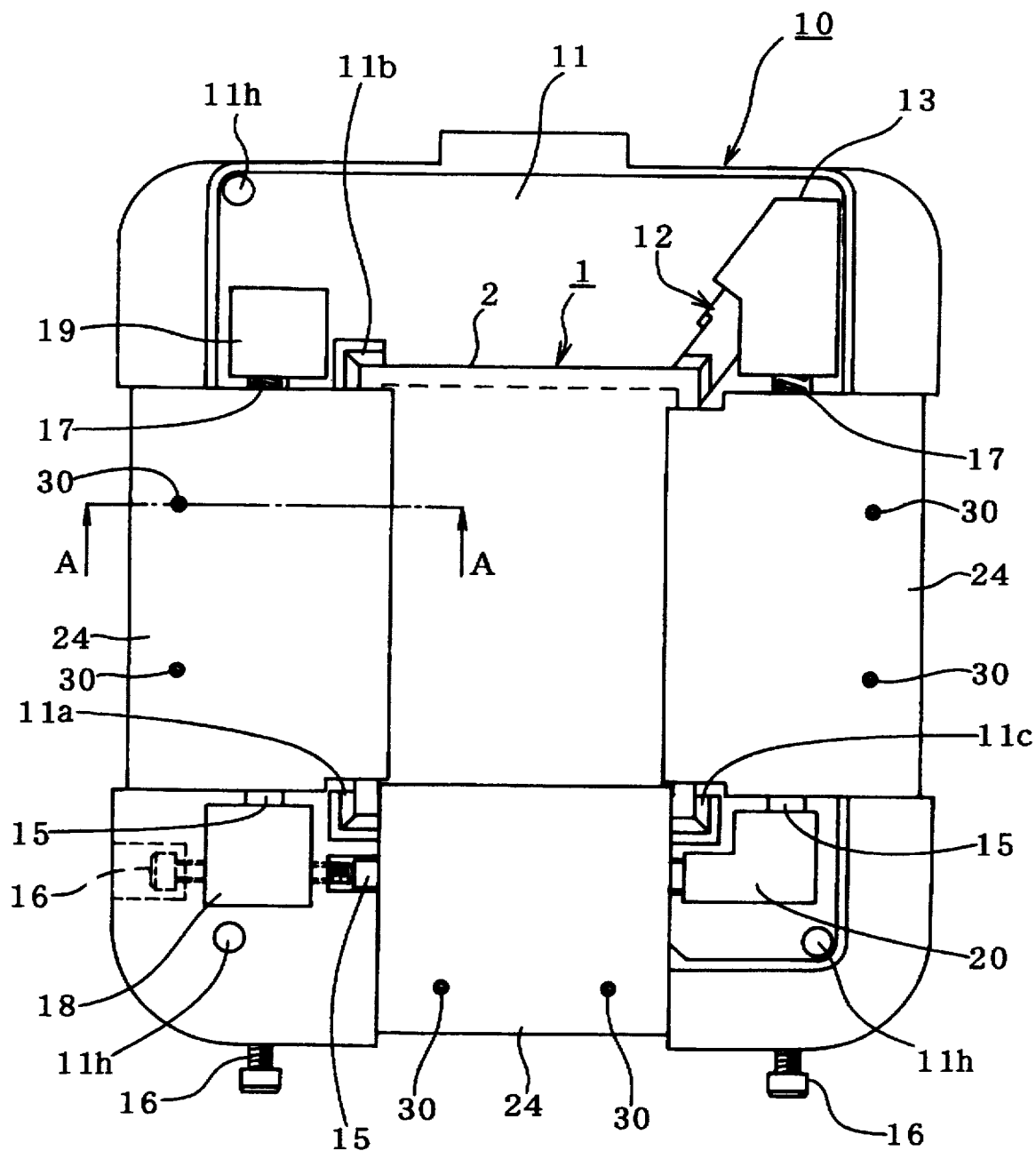
FIG. 1 is a plan view of a socket showing a first embodiment of a case where the present invention is applied to a socket for inspecting a liquid crystal display panel and shows a state where the clip members are moved to a pressing position.

Below, an explanation will be made of embodiments of the present invention referring to the drawings. FIG. 1 to FIG. 8 show a first embodiment of a case where the present invention is applied to a socket for inspecting a liquid crystal display panel.

Figure 2:
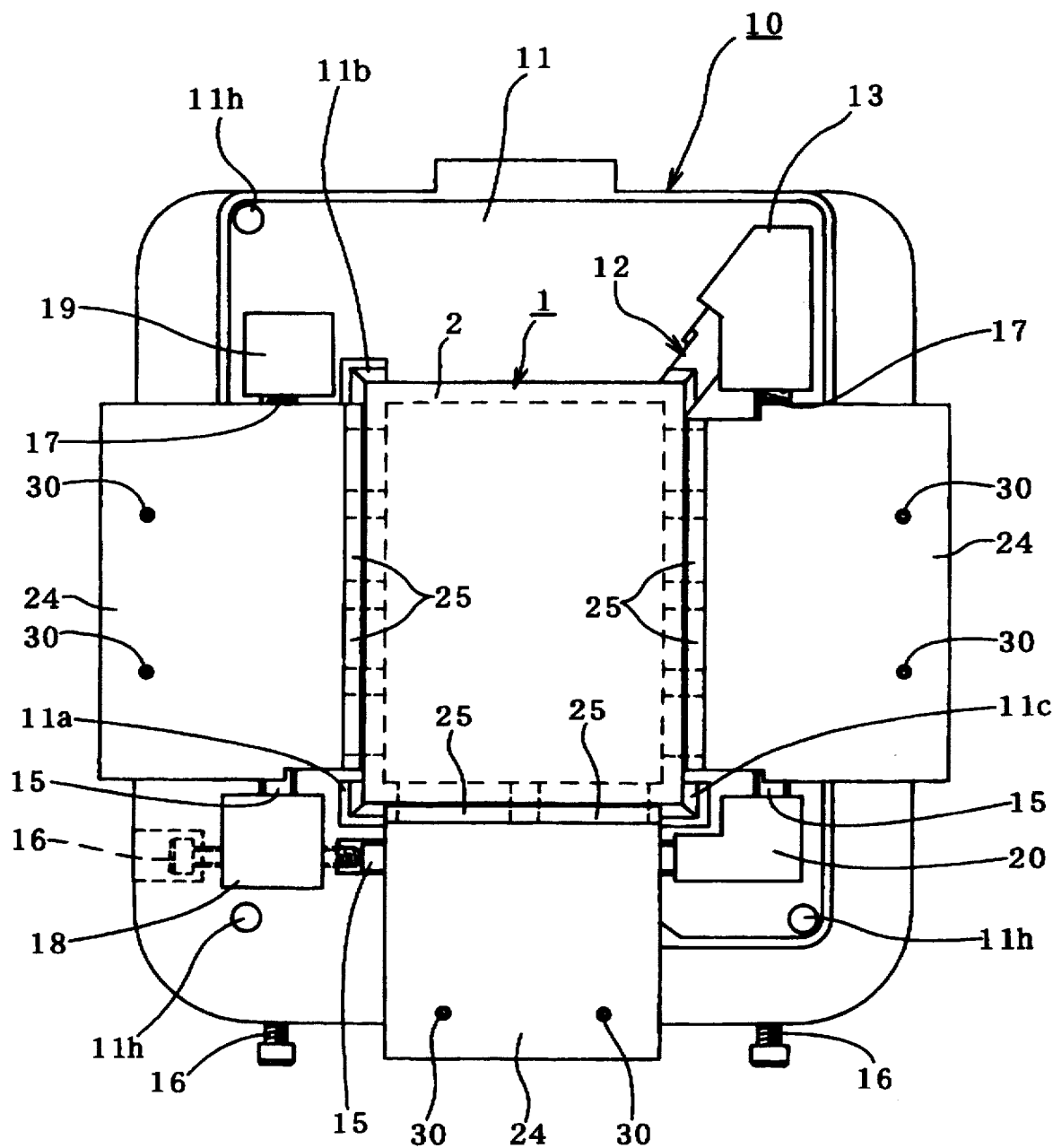
FIG. 2 is a plan view showing a state where the clip members of the socket shown in FIG. 1 are moved to a releasing position.
Figure 3:
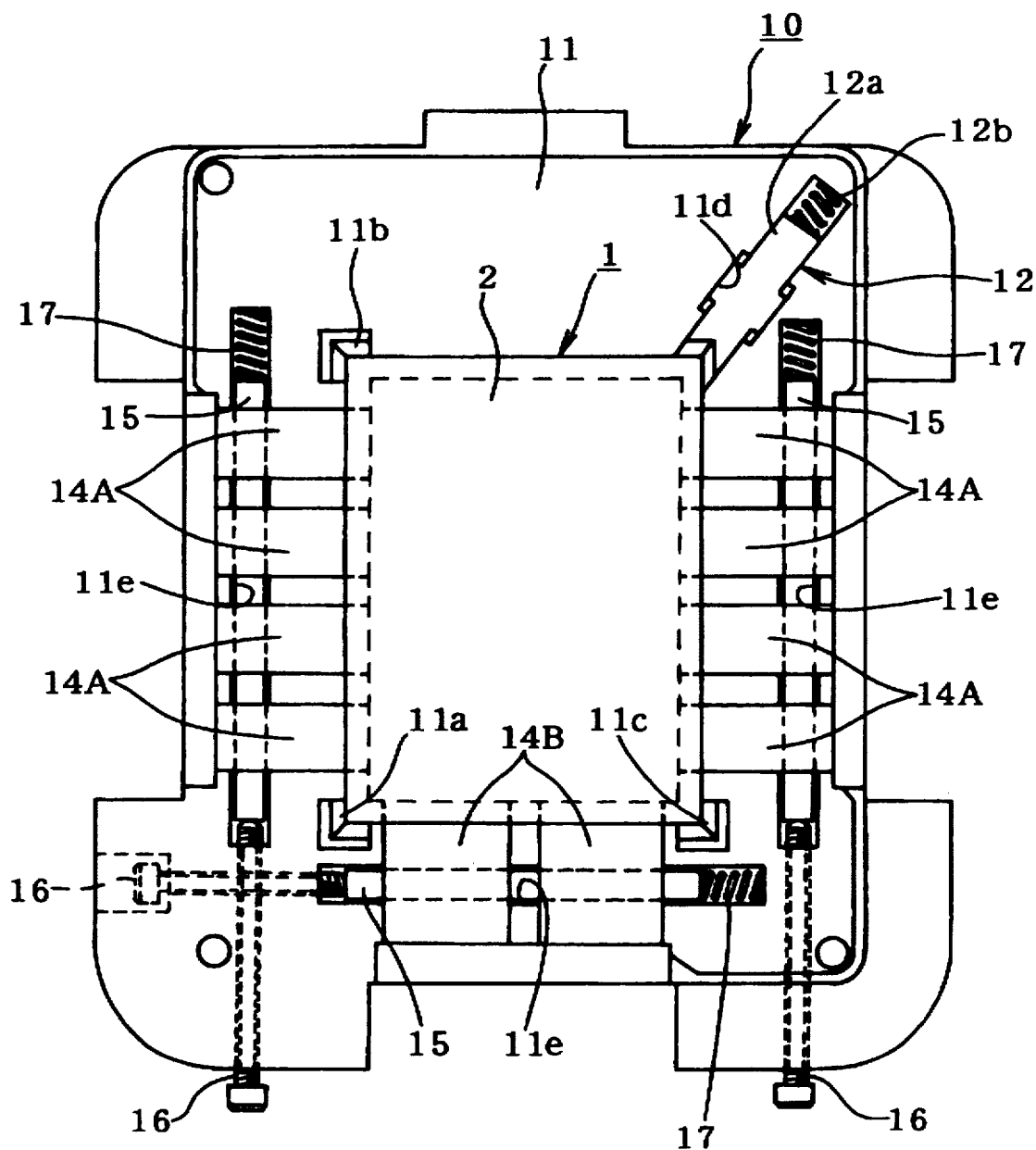
FIG. 3 is a plan view showing a state where the clip members, protecting films, covers, etc. of the socket shown in FIG. 1 are removed.

Referring FIGS. 1 to 3 at first, a liquid crystal display panel 1 having a schematically rectangular flat surface has an insulating base plate 2 made of for example a glass. A plurality of electrode terminals are formed and arranged in parallel on the bottom surface of this insulating base plate 2 along the three sides of the insulating base plate 2. A socket 10 for inspecting a liquid crystal display panel according to the first embodiment of the present invention is provided with a socket body 11 having a schematically rectangular flat surface made of metal or plastic. Corner engagement pieces 11a to 11c to be engaged with the three corners of the insulating base plate 2 of the liquid crystal display panel 1 are formed on the top surface of this socket body 11 so as to be projected therefrom. Two facing engagement pieces 11b and 11c among these three corner engagement pieces 11a to 11c roughly perform the positioning of the insulating base plate 2 of the liquid crystal display panel 10. The remaining corner engagement piece 11a acts as a base plate positioning means for correctly positioning the short sides and long sides of the insulating base plate 2 at the reference surface positions, respectively. In the socket body 11, a base plate end pressing means 12 for pressing the insulating base plate 2 toward the corner engagement piece 11a is provided so as to face this corner engagement piece 11a in a diagonal direction. This base plate end pressing means 12 has a moveable engagement piece 12a engaged with the corner of the insulating base plate 2 and a coil spring 12b biasing this moveable engagement piece 12a in the direction of the corner engagement piece 11a. These moveable engagement piece 12a and coil spring 12b are accommodated in a recessed portion 11d made in the top surface of the socket body 11 and covered by a cover 13. The spring force of the coil spring 12b is set to a strength that allows for a change in the dimensions of the insulating base plate 2 due to linear expansion in the direction of arrangement of the electrode terminals of the insulating base plate 2.

Figure 4:
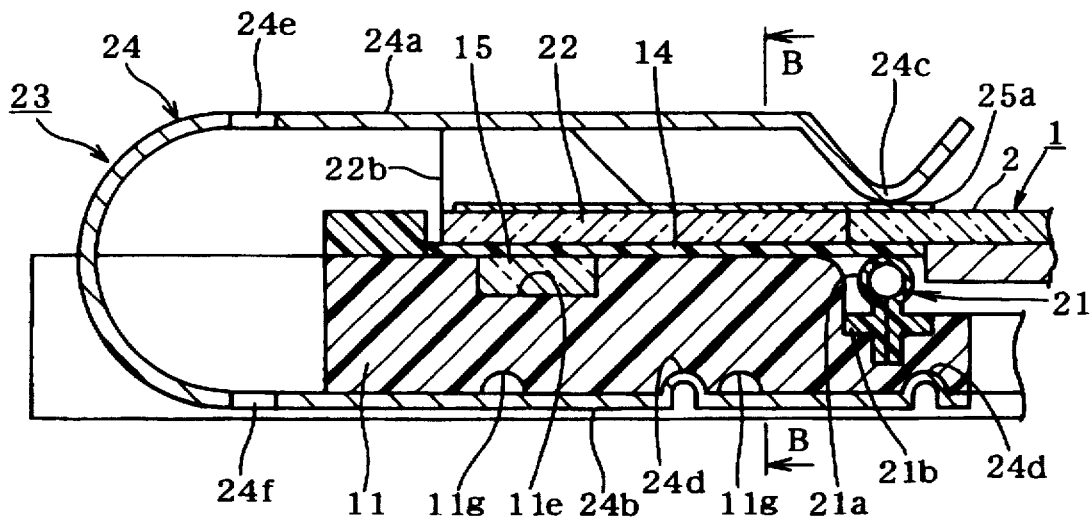
FIG. 4 is a sectional view of the socket shown in FIG. 1 taken along a line A—A in FIG. 1.

As shown in FIGS. 3 and 4, corresponding to the sides of the insulating base plate 2 of the liquid crystal display panel 1 on which the electrode terminals are formed, recessed grooves lie extending in parallel to the sides of the insulating base plate 2 are formed in the top surface of the socket body 11. Film attachment plates 15 made of an insulating material having almost the same linear expansion coefficient as that of the insulating base plate 2, for example, the same material as that for the insulating base plate 2, are accommodated in the recessed grooves 11e so that they can slide in the longitudinal direction thereof. On the top surface of each film attachment plate 15, the base ends of a plurality of contact films 14 serving as the contact members with respect to the electrode terminals of the liquid crystal display panel 1 are affixed by for example a binder. In this embodiment, four contact films 14 are disposed in parallel on the film attachment plates 15 for the long sides corresponding to the group of electrode terminals of the long sides of the liquid crystal display panel 1, and two contact films 14 are disposed in parallel on the film attachment plate 15 for the short side corresponding to the group of electrode terminals of the short side of the liquid crystal display panel 1.

One end of each recessed groove 11e is provided with an adjustment screw 16 for the positioning serving as the attachment plate positioning means for positioning one end of the film attachment plate 15 on the same reference surface as one end of the insulating base plate 2. The front end of this adjustment screw 16 abuts against one end of the film attachment plate 15. The front end position of the adjustment screw 16 can be adjusted by turning the head of the adjustment screw 16 by an implement or the like. Further, a coil spring 17 serving as the attachment plate end pressing means for pressing the film attachment plate 15 against the positioning adjustment screw 16 while abutting against the other end of the film attachment plate 15 is provided at the other end portion of the recessed groove 11e. The spring force of this coil spring 17 is set to a strength that allows the dimensional change of the film attachment plate 15 due to linear expansion in the direction of arrangement of the contacts. Reference numerals 18 to 20 shows covers for covering the ends of the recessed grooves 11e.

Each contact film 14 is formed by laminating a plurality of contacts (not shown) to be brought into contact with the electrode terminals on the top surface of the insulative flexible film and enable the supply of a pixel driving signal to each of the electrode terminals from the contacts in a state where the contacts on the front end of the contact film 14 and the electrode terminals of the liquid crystal display panel 1 are brought into contact with each other. The contacts on the contact film 14 can be detachably connected to an external circuit device provided with a pixel driving IC via for example a connection socket (not shown).

An elastic supporting member 21 for supporting the front end of the contact film 14 from the bottom is provided in the socket body 11 so as to be in resilient contact with the back surface of the front end of the contact film 14. The elastic supporting member 21 has a cylindrical portion 21a abutting against the back surface of the front end of the contact film 14 and a plinth portion 21b connected to the lower portion of the cylindrical portion 21a. In this embodiment, the elastic supporting member 21 is cut into two at the position dividing the lower portion of the cylindrical portion 21a and the plinth portion 21b over the entire length thereof. The cylindrical portion 21a is formed by rounding a material shaped in the form of a flat plate into a cylindrical shape, so in comparison with a case where the elastic supporting member is formed by extrusion, the linearity of the contact portion of the cylindrical portion 21a with respect to the back surface of the front end of the contact film 14 in the longitudinal direction and the dimensional precision such as the thickness can be easily enhanced. Accordingly, the electrode terminals of the display panel 1 and the contacts on the front end of the contact film 14 can be brought into contact with each other under a uniform contact pressure.

Figure 6:
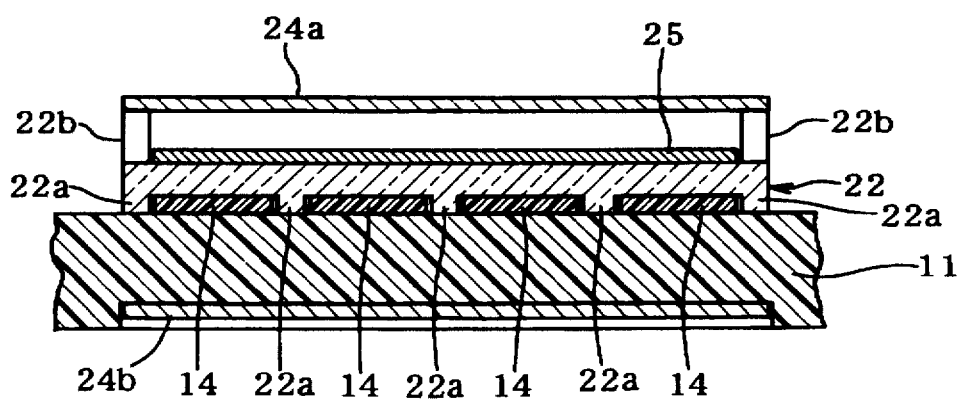
FIG. 6 is a sectional view of principal parts of the socket shown in FIG. 1 taken along a line B—B in FIG. 4.

As shown in FIGS. 4 and 6, supporting plates 22 abutting against the sides of the insulating base plate 2 and located above the contact films 14 are affixed to the top surface of the socket body 11. The supporting plates 22 have top surfaces serving as guide surfaces becoming substantially continuous with the top surface of the insulating base plate 2 placed and brought into contact with the top of the contact films 14. A plurality of lower ribs 22a abutting against the top surface of the socket body 11 are formed on the bottom surfaces of the supporting plates 22. The contact films 14 are disposed with a clearance between the lower ribs 22a of the supporting plates 22 so that they can displace in accordance with the linear expansion of the film attachment plates 15. Note that, it is also possible to form similar ribs on the top surface of the socket body 11 so as to be projected therefrom in place of the lower ribs 22a of the supporting plates 22.

The socket 10 is provided with a pressing member 23 for pressing the insulating base plate 2 of the liquid crystal display panel 1 from the top. In this embodiment, the pressing member 23 is provided with clip members 24 each having a schematically U-shaped cross-section having an upper spring piece 24a at one side thereof and a lower spring piece 24b at the other side and with protecting films 25. The clip member 24 can slide between a pressing position for gripping the insulating base plate 2 and the socket body 11 (refer to FIG. 4) and a releasing position for gripping a supporting plate 22 and the socket body 11 and releasing the insulating base plate 2 (refer to FIG. 5). A pressing portion 24c is formed by bending the front end of the upper spring piece 24a of the clip member 24.

Figure 5:
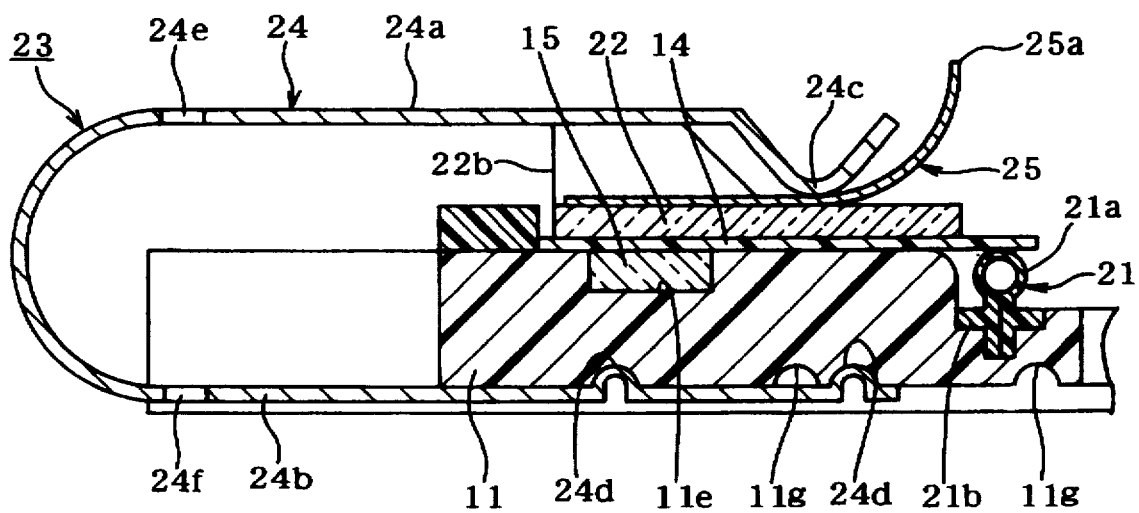
FIG. 5 is a sectional view similar to FIG. 4 in a state where the clip members are moved to the releasing position.
Figure 8A:
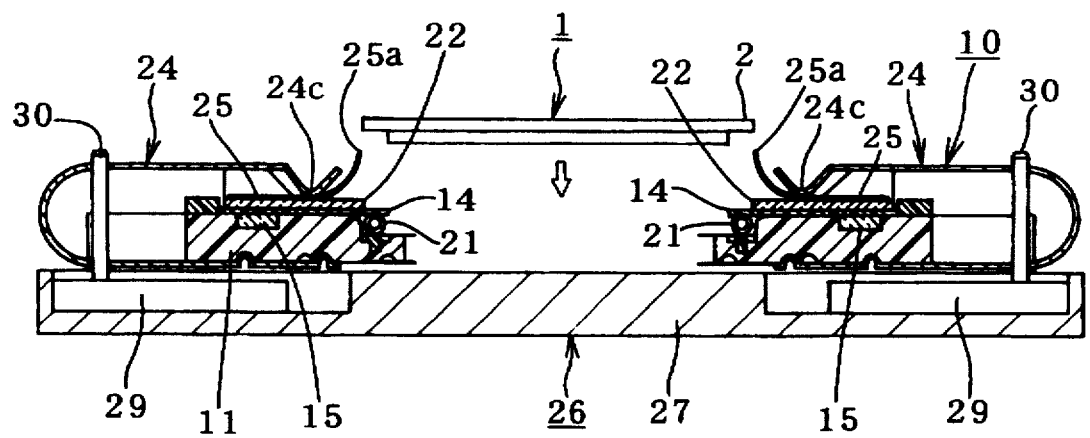
FIGS. 8A to FIG. 8C are sectional views showing the operation of the socket shown in FIG. 1, respectively.
Figure 8B:
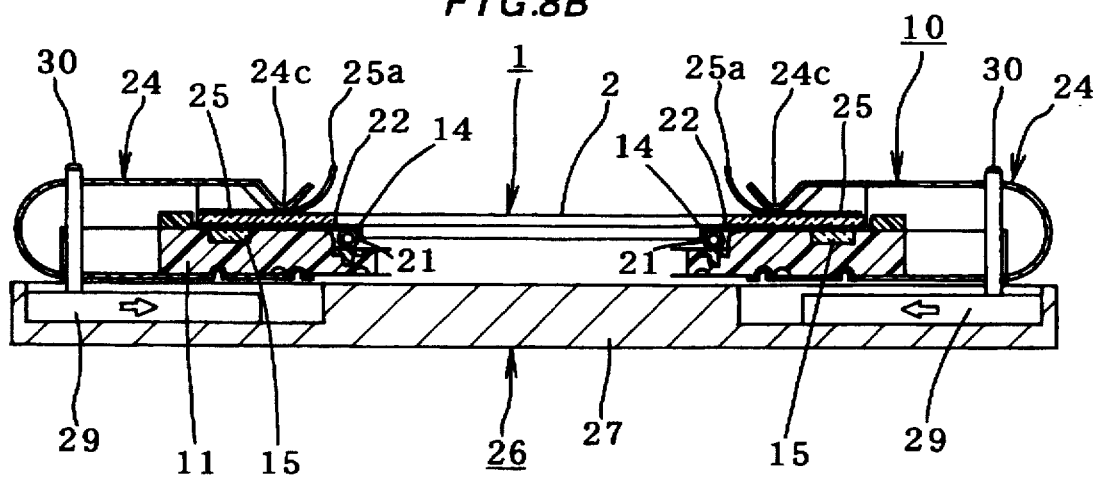

The base end of each protecting film 25 is fixed to the top surface of a supporting plate 22 by a binder or the like. Further, as shown in FIG. 4, the protecting film 25 is set in its dimensions so that the front end 25a thereof is interposed between the pressing portion 24c of the front end of the upper spring piece 24a of a clip member 24 and the top surface of the insulating base plate 2 when the clip member 24 is located at the pressing position. Further, the front end portion 25a of the protecting film 25 is formed so as to release the mounting region of the insulating base plate 2 of the liquid crystal display panel 1 by the removal of the front end 25a thereof from the top surface of the insulating base plate 2 by the curling tendency of the film per se when the clip member 24 is located at the releasing position as shown in FIGS. 5, 8A, and 8B. A protecting film 25 having such a curling tendency can be formed by a metal or a plastic, but preferably a material having an excellent surface lubricity is used.

As seen from FIGS. 4 and 6, a plurality of guide ribs 22b slidably supporting the upper spring piece 24a by abutting against the inner surface, that is, the bottom surface of the upper spring piece 24a of the clip member 24, are formed on the top surface of the supporting plate 22 so as to project therefrom.

Further, as shown in FIGS. 4 and 5, an upward projection 24d is formed at the lower spring piece 24b of the clip member 24 so as to extend therefrom. On the bottom surface of the socket body 11, a recessed portion 11g which resiliently contacts and engages with the projection 24d of the clip member 24 when the clip member 24 is located at the pressing position and releasing position is formed. Accordingly, the clip member 24 can be stably fixed at the pressing portion and the releasing position.

Figure 7A:
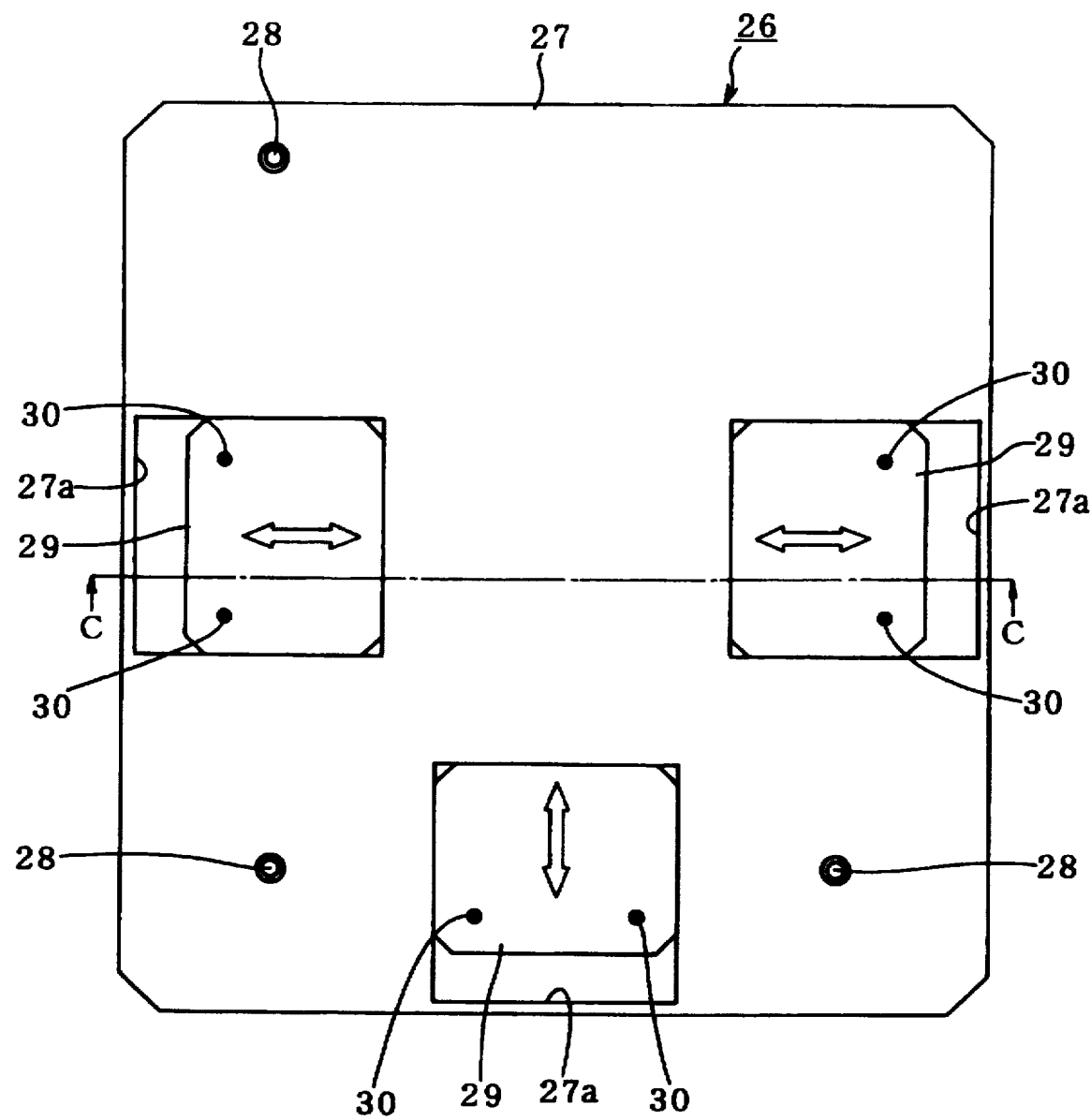
FIG. 7A is a plan view showing an example of the structure of a jig used for attachment and detachment work of the display panel to and from the socket shown in FIG. 1.
Figure 7B:
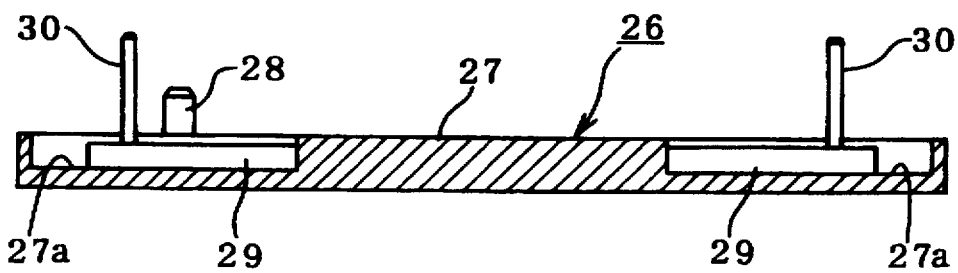
FIG. 7B is a sectional view taken along a line C—C in FIG. 7A.

When attaching and detaching the liquid crystal display panel 1 to and from the socket 10, the socket body 11 is mounted on the jig 26 shown in FIGS. 7A and 7B. This jig 26 is provided with a base stand 27 from the top surface of which positioning pins 28 are projected, moveable supporting pieces 29 held in recessed portions 27a formed in the top surface of the base stand 27 so that they can slide, and engagement pins 30 projecting from the top surface of the moveable supporting pieces 29. As shown in FIGS. 1 to 3, positioning holes 11h fitting with the positioning pins 28 of the jig 26 are formed in the socket body 11. Further, as shown in FIGS. 4 and 8A, engagement holes 24e and 24f for engagement with the engagement pins 30 are made in the upper spring piece 24a and the lower spring piece 24b of the clip member 24, respectively. The engagement pins 30 are inserted into the engagement holes 24e and 24f of the clip member 24 when the socket body 11 is mounted on the base stand 27 of the jig 26 and positioned. Accordingly, after the socket body 11 is mounted on the base stand 27 of the jig 26, the moveable supporting pieces 29 are slid manually or automatically by using an actuator (not shown), whereby the clip member 24 can be easily slid.

In the display panel inspection socket having the above configuration, since the pressing member 23 is constituted by clip members 24 which can slide and the protecting films 25, a reduction of weight and a reduction of size of the entire socket becomes possible. Further, since the clip members 24 are preliminarily mounted on the sides of the socket body 11, the clip members 24 can be easily moved from the releasing position to the pressing position and, at the same time, the positional deviation between the electrode terminals of the liquid crystal display panel 1 and the contacts of the contact film 14 when the clip members 24 are moved from the releasing position to the pressing position can be suppressed to the minimum level.

Further, when the clip members 24 move from the pressing position to the releasing position, as shown in FIGS. 8A and 8B, the front ends 25a of the protecting films 25 curl upward due to the curling tendency of the films per se, move to the outside of the insulating base plate mounting region, and release the liquid crystal display panel 1, therefore when the liquid crystal display panel 1 is mounted on the front ends of the contact films 14 on the socket body 11 or the liquid crystal display panel 1 is removed from the top of the socket body 11, the protecting films 25 do not interfere with the liquid crystal display panel 1, and therefore the efficiency of the work of attachment and detachment of the liquid crystal display panel 1 becomes good.

Figure 8C:
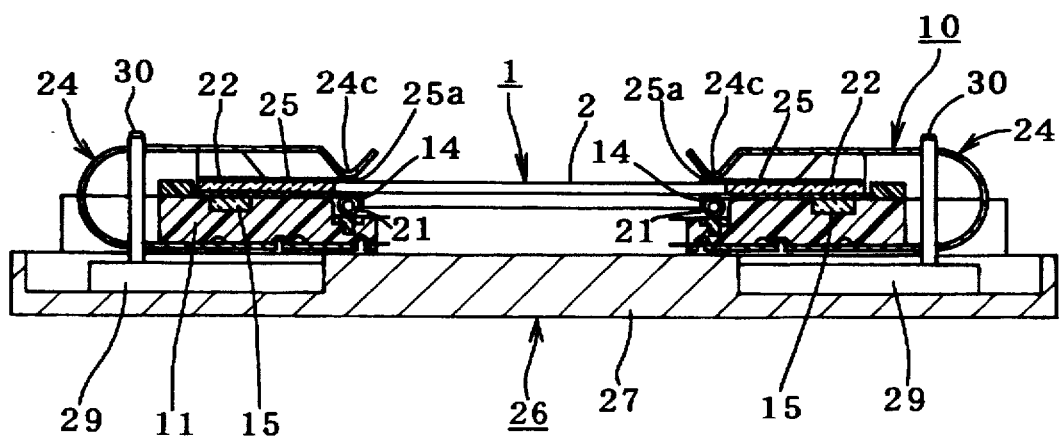

After the liquid crystal display panel 1 is mounted, when the clip members 24 are slid from the releasing position to the pressing position, one ends of the clip members 24, that is, the pressing portions 24c of the upper spring pieces 24a, move from the top of the supporting plate 22 to the top of the insulating base plate 2 while sliding on the protecting films 25. During this time, along with the movement of the pressing portions 24c, the front ends 25a of the protecting films 25 are pressed and extended by the pressing member 24 from the upward curling state and resiliently deformed to a straight state. Then, when the clip members 24 are located at the pressing position, as shown in FIGS. 4 and 8C, the pressing portions 24c of the clip members 24 press the top surface of the insulating base plate 2 via the front ends 25a of the protecting films 25. The base ends of the protecting films 25 are affixed to the supporting plates 22, therefore the pressing force of the clip members 24 in the sliding direction is not transferred to the insulating base plate 2 via the protecting films 25 at the sliding of the clip members 24. Accordingly, positional deviation between the electrode terminals of the liquid crystal display panel 1 and the contacts of the contact film 14 due to the positional deviation of the insulating base plate 2 can be prevented. Accordingly, the positioning precision between the electrode terminals of the liquid crystal display panel 1 and the contacts of the contact films 14 can be held.

Further, in a socket 10 having the above configuration, elastic supporting members 21 which extend in the direction of arrangement of the contacts of the contact films 14 and resiliently support the back surface of the front ends of the contact films 14 from the bottom are provided in the socket body 11, therefore when the insulating base plate 2 of the liquid crystal display panel 1 is pressed by the pressing members 24c of the clip members 24, part of each contact on the contact films 14 can be reliably pressed against the electrode terminals on the insulating base plate 2 from the back surface side of the contact films 14 by the elastic supporting members 21. Accordingly, the electrical connection between the electrode terminals of the liquid crystal display panel 1 and the contacts of the contact films 14 can be more reliably carried out.

Further, in the socket 10 having the above configuration, as mentioned above, the contact films 14 are affixed to film attachment plates 15 having almost the same coefficient of linear expansion as that of the insulating base plate 2 of the liquid crystal display panel 1 and the socket body 11 is provided with a corner engagement piece (base plate positioning means) 11a for positioning one end of the insulating base plate 2 in the direction of arrangement of the electrode terminals of the liquid crystal display panel 1, a base plate end pressing means 12 for pressing the other end of the insulating base plate 2 against the corner engagement piece 11a with a strength that enables allowance of a change in the dimension of the insulating base plate 2 due to linear expansion in the direction of arrangement of the electrode terminals, adjustment screws (attachment plate positioning means) 16 for positioning one end of the film attachment plates 15 in the direction of arrangement of the contacts on the same reference surface as one end of the insulating base plate 2, and coil springs (attachment plate end pressing means) 17 for pressing the other ends of the film attachment plates 15 against the adjustment screws 15 with a strength that enables allowance of a change in the dimensions of the film attachment plates 15 due to linear expansion in the direction of arrangement of the contacts, therefore, when the insulating base plate 2 of the liquid crystal display panel 1 is mounted on the contact films 14 of the socket body 11, by abutting one end of the insulating base plate 2 against the corner engagement piece 11a to perform the positioning, the electrode terminals of the liquid crystal display panel 1 and the contacts of the contact films 14 can be correctly positioned. Then, when the temperature of the inspection environment of the socket on which the liquid crystal display panel 1 is mounted changes, one ends of the film attachment plates 15 and one end of the insulating base plate 2 of the liquid crystal display panel 1 can be held on the same reference surface by the corner engagement piece 11a and the adjustment screws 16 and, at the same time, the amount of change of dimensions due to the linear expansion of the insulating base plate 2 and the film attachment plates 15 can be held almost the same in the direction of arrangement of the electrode terminals and contacts, and accordingly the positional deviation between the electrode terminals and the contacts of the contact films 14 due to the linear expansion of the insulating base plate 2 and the film attachment plates 15 can be prevented. Accordingly, the electrode terminals of the liquid crystal display panel 1 and the contacts of the contact films can be reliably held in an electrical connection state under a wide range of temperature environments, therefore the inspection of the quality of the display of the liquid crystal display panel 1 can be correctly carried out under a wide range of temperature environments.

Further, in a socket 10 having the above configuration, the abutment positions of the attachment plate positioning means and the film attachment plates can be adjusted in the direction of arrangement of the contacts by the adjusting means, therefore one ends of the film attachment plates 14 in the direction of arrangement of the contacts and one end of the insulating base plate 2 in the direction of arrangement of the electrode terminals of the liquid crystal display panel 1 can be correctly positioned on the same reference surface. Accordingly, the electrode terminals of the liquid crystal display panel 1 and the contacts of the contact films 14 can be reliably positioned, therefore the inspection of the quality of the display of the liquid crystal display panel 1 can be correctly carried out.

Note that the first embodiment was configured so that the front ends of the protecting films 25 moved to the outside of the insulating base plate mounting region by their own curling tendency when the clip members 24 moved from the pressing position to the releasing position, but it is also possible if the front ends of the protecting films are connected to the front ends of the clip members instead of giving a curling tendency to the front ends of the protecting films. In this case, when the clip members move from the pressing position to the releasing position, the front ends of the protecting films will move to the outside of the insulating base plate mounting region by being pulled to the front end by the clip members.

Further, the first embodiment used a single protecting film 25 for a plurality of contact films 14 in each of the columns, but it is also possible if a plurality of protecting films corresponding to the number of the contact films 14 in each of the columns are affixed onto the supporting plates 22. Further, it is also possible to form the pressing portions 24c in the form of comb teeth by forming a plurality of slits in one ends of the clip members 24, that is, the pressing portions 24c, corresponding to the number of the contact films 14 arranged in each column. By forming the pressing portions 24c of the clip members 24 in a comb tooth shape in this way, the pressing force can be uniformly applied upon the insulating base plate 2.

Figure 13:
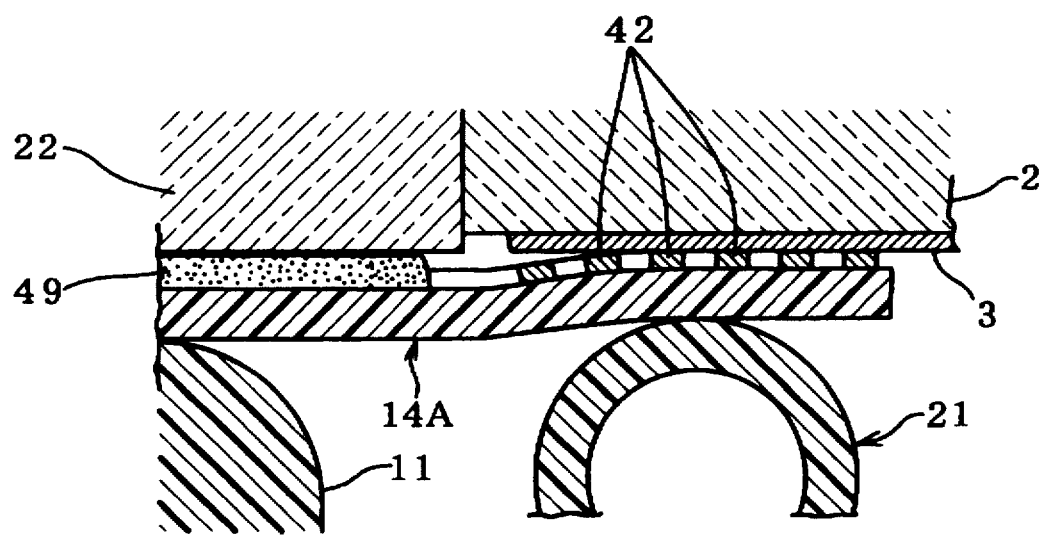
FIG. 13 is an enlarged sectional view of a contact portion between a source side electrode terminal and a contact film for the source electrode terminals in the liquid crystal display panel in the second embodiment.
Figure 14:
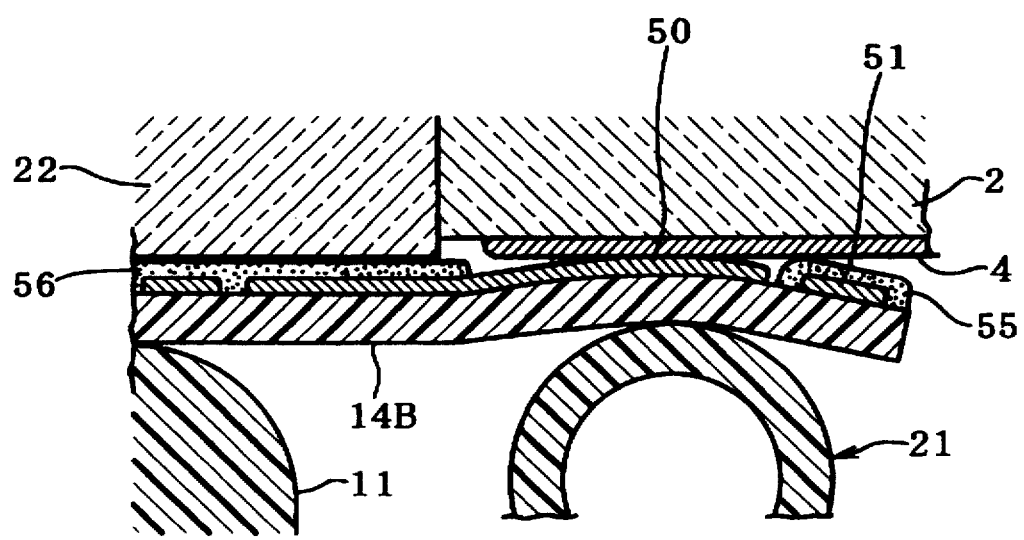
FIG. 14 is an enlarged sectional view of a contact portion between a gate side electrode terminal and a contact film for the gate electrode terminals in the liquid crystal display panel in the second embodiment.
Figure 15:
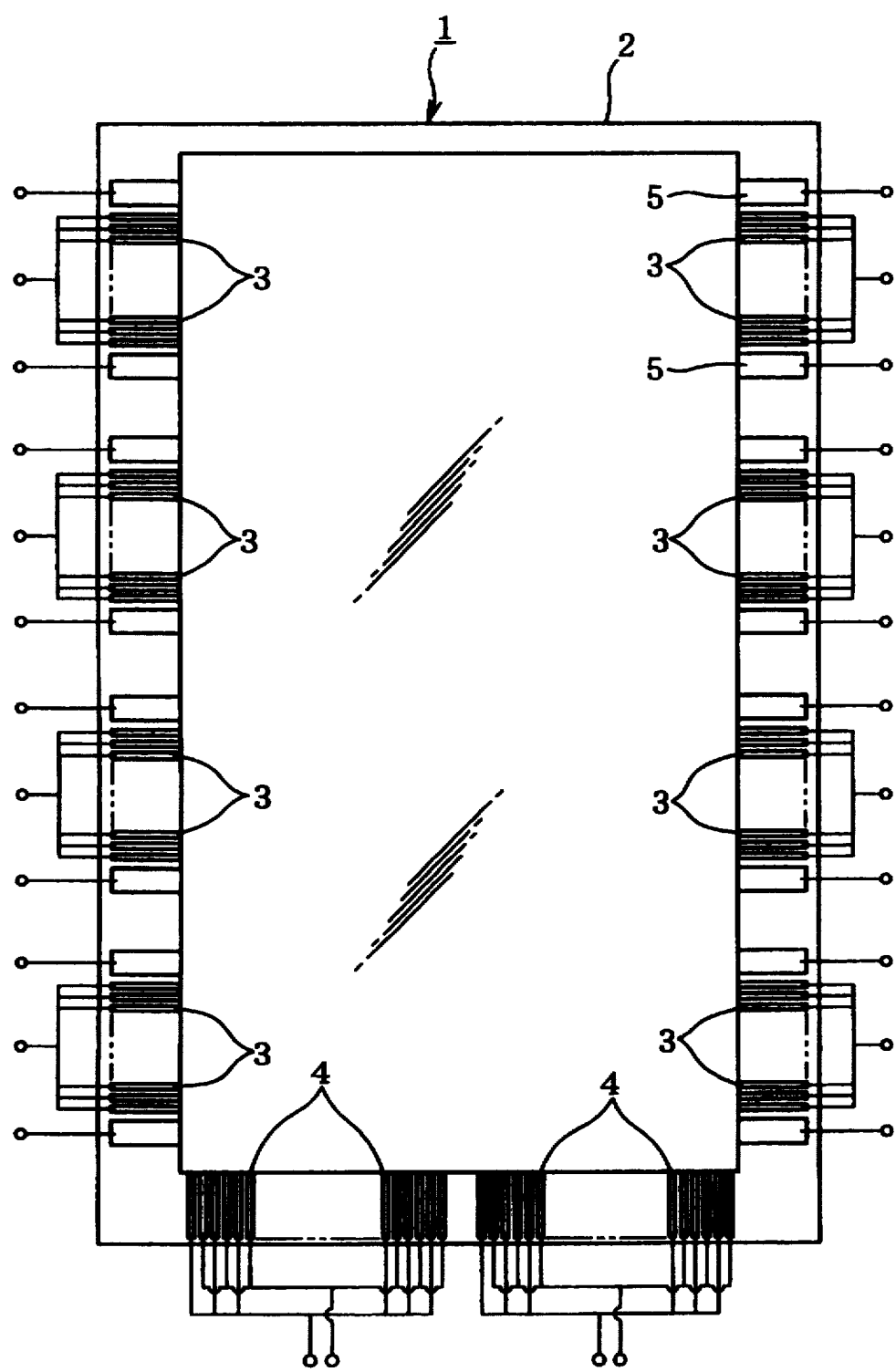
FIG. 15 is a schematic plan view showing a liquid crystal display panel to be mounted on the display panel inspection socket of the second embodiment and a connecting method of signal wiring for inspection to the panel.

FIGS. 9 to 14 show a second embodiment of the display panel inspection socket according to the present invention; and FIG. 15 is an explanatory view of the liquid crystal display panel mounted in the socket of this second embodiment. In these views, the same reference numerals are given for constituent elements similar to those of the first embodiment.

As shown in FIG. 15, on the transparent insulating base plate 2 of a liquid crystal display panel 1, a large number of source side electrode terminals 3 arranged at a fine pitch along the long sides thereof and a large number of gate side electrode terminals 4 arranged at a fine pitch along a short side of the insulating base plate 2 are formed. The source side electrode terminals 3 are divided into a plurality of blocks corresponding to the number of the connecting terminals of the liquid crystal driving module to be connected to the source side electrode terminals 3 of the liquid crystal display panel 1 after the inspection of the liquid crystal display panel 1. Common electrode terminals 5 are disposed on the two sides of every block of the source side electrode terminals 3. However, the configuration of this liquid crystal display panel 1 is only one example.

Figure 9:
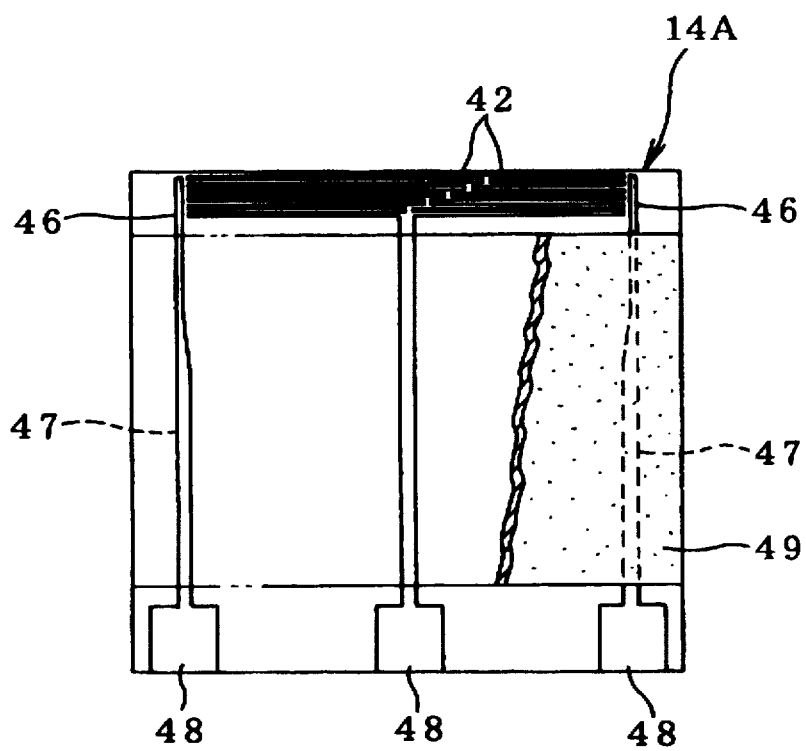
FIG. 9 is a partially sectional plan view of a contact film for source side electrode terminals of the display panel inspection socket according to a second embodiment of the present invention.
Figure 10:
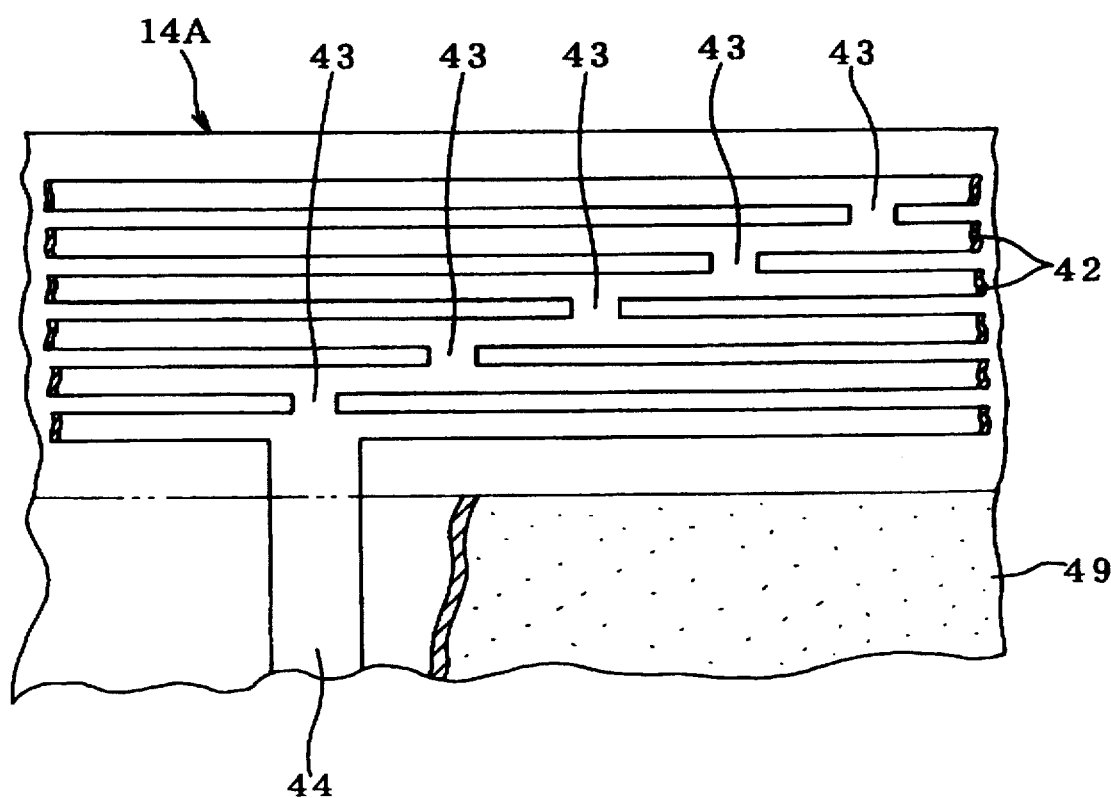
FIG. 10 is a partially sectional enlarged view of the principal parts of the contact film for the source side electrode terminals shown in FIG. 9.

As shown in FIGS. 9, 10, and 13, a plurality of contacts 42 for contacting with the source side electrode terminal 3 of the liquid crystal display panel 1 are formed on the surface of the front ends of the source side electrode terminal use contact films 14A made of the insulative flexible films used in the socket of the second embodiment. The plurality of contacts 42 are arranged in a direction orthogonal to the direction of arrangement of the source side electrode terminals 3 of the liquid crystal display panel 1 and extend in parallel to the direction of arrangement of the source side electrode terminals 3. They are connected to each other via a plurality of connecting portions 43. One of the contacts 42 is connected to an electrode pad 45 for connection to the outside formed on the surface of the base end of each of the contact films 14A via a lead pattern 44. Further, two common-electrode-terminal use contacts 46 for contact with the common electrode terminals 5 of the liquid crystal display panel 1 are formed on the surface of the contact films 14A. Each common-electrode-terminal use contact 46 is connected to the electrode pad 48 for connection to the outside formed on the surface of the base end of the contact film 14A via the lead pattern 47. The section between the front end of the surface of a contact film 14A and the base end is covered by an insulating coating film 45 which is indicated as a partially sectional view.

Further, in each of the contact films 14A for the source side electrode terminal of this second embodiment, as shown in FIG. 10, a plurality of connecting portions 43 connecting two contacts 42 are provided between adjacent columns of the contacts 42 for the source side electrode terminals. These plurality of connecting portions 43 are arranged shifted in positions from each other along the direction of arrangement of the source side electrode terminals 3 of the liquid crystal display panel 1.

Figure 11:
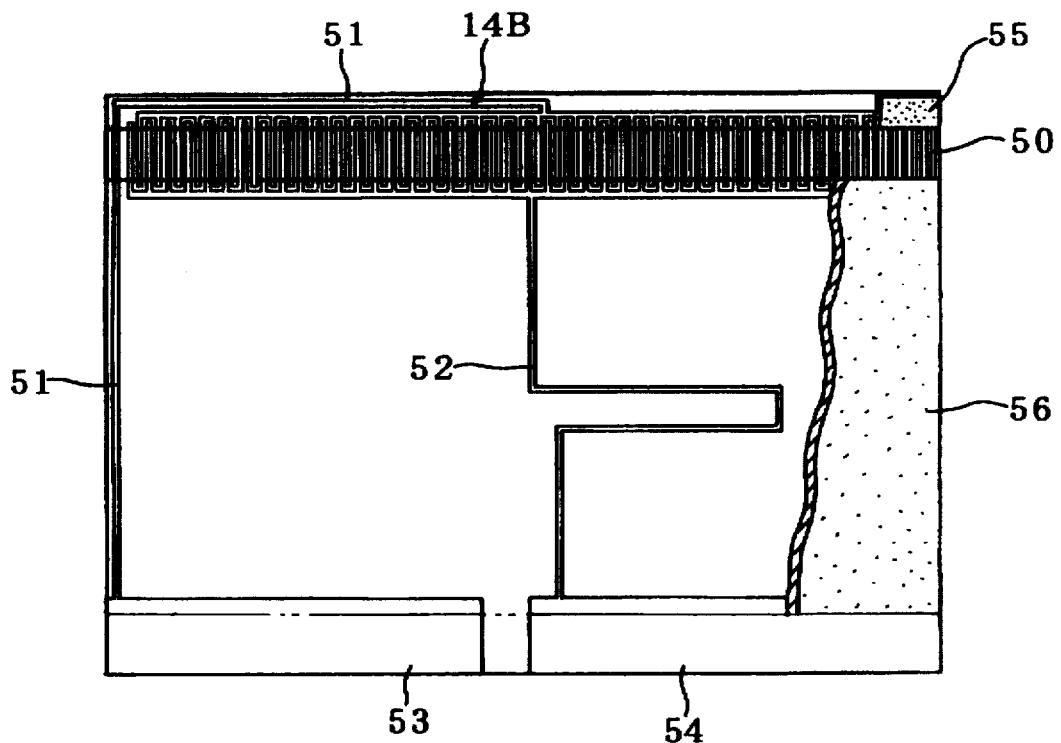
FIG. 11 is a partially sectional plan view of a contact film for gate side electrode terminals of the display panel inspection socket according to the second embodiment of the present invention.
Figure 12A:
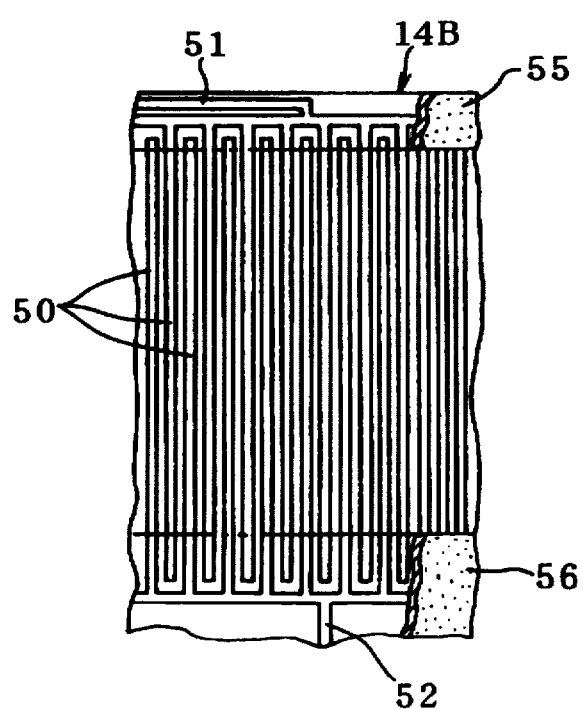
FIGS. 12A and 12B are partially sectional enlarged views of the principal parts of the contact film for the gate side electrode terminals shown in FIG. 11.
Figure 12B:
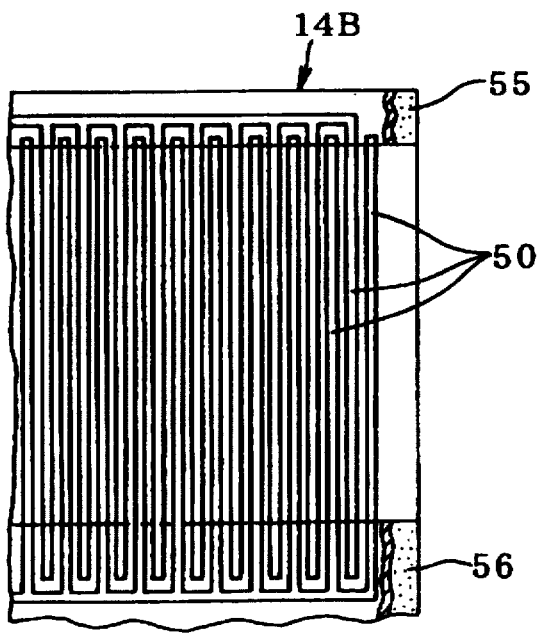

On the other hand, as shown in FIGS. 11, 12, and 14, a plurality of contacts 50 for contact with the gate side electrode terminals 4 of the liquid crystal display panel 1 are formed on the surface of the front ends of the gate side electrode terminal use contact films 14B made of the insulative flexible film used in the socket of the second embodiment. The plurality of contacts 50 are arranged in the same direction as the direction of arrangement of the gate side electrode terminals 4 of the liquid crystal display panel 1. As shown in detail in FIGS. 12A and 12B, the contacts 50 of the odd number columns and the contacts 50 of the even number columns are respectively formed in comb tooth shapes while being connected to each other on one end side and the other end side of the pattern 50, respectively. Further, the contacts 50 of the odd number columns and the even number columns are connected to the electrode pads 53 and 54 for connection to the outside formed on the surface of the base ends of the contact films 14B via the lead patterns 51 and 52, respectively. Further, on the surface of the front ends of the contact films 14B for the gate side electrode terminals, insulating coating films 55 and 56 coating the connection regions on one end side and the other end side of the contacts 50 are formed.

The contact films 14A and 14B can be connected to an outside circuit device (not shown) provided with the pixel driving IC when inserting the base ends into the socket (not shown) of a connection cable.

In the socket of the second embodiment having the above configuration, after the insulating base plate 2 of the liquid crystal display panel 1 is placed on the contact films 14A and 14B for the source side electrode terminals and the gate side electrode terminals on the socket body 11, the clip members 24 are slid from the releasing position to the pressing position, whereby the pressing force can be given to the top surface, that is, the back surface of the insulating base plate 2 of the liquid crystal display panel 1, therefore the source side and gate side electrode terminals 3 and 4 of the liquid crystal display panel 1 can be brought into contact with the surface of the front ends of the contact films 14A and 14B for the source side electrode terminals and the gate side electrode terminals under the required contact pressures, respectively. At this time, since contact patterns 42 extending in parallel to the direction of arrangement of the source side electrode terminals 3 of the liquid crystal display panel 1 are formed on the surface of the front ends of the contact films 14A for the source side electrode terminals, the source side electrode terminals 3 of the liquid crystal display panel 1 and the contact patterns 42 on the contact films 14A for the source side electrode terminals can be simultaneously and reliably brought into contact. Accordingly, the same signal can be reliably simultaneously supplied to the source side electrode terminals 3 of the liquid crystal display panel 1.

Further, corresponding to the arrangement of the plurality of gate side electrode terminals 4 of the liquid crystal display panel 1, a plurality of contact patterns 50 are arranged on the surface of the front ends of the contact films 14B for the gate side electrode terminals, the contact patterns 50 of the odd number columns and the contact patterns 50 of the even number columns are connected to each other on one end side and the other end side of the patterns, respectively, and further insulating coating films 55 and 56 coating the connecting regions of the contact patterns 50 are formed on the surface of the front ends of the contact films 14B for the gate side electrode terminals, therefore only the contact patterns 42 of the odd number columns can be contacted with the gate side electrode terminals 4 of the odd number columns of the liquid crystal display panel 1, and only the contact patterns 42 of the even number columns can be contacted with the gate side electrode terminals 4 of the even number columns, respectively. Accordingly, the same signal can be selectively simultaneously supplied to the gate side electrode terminals 4 of the odd number columns or the even number columns of the liquid crystal display panel 1.

Further, in the socket 10 of the second embodiment, as mentioned above, since a plurality of contact patterns 42 are arranged on the surface of the front ends of the contact films 14A for the source side electrode terminals in a direction orthogonal to the direction of arrangement of the source side electrode terminals 3 of the liquid crystal display panel 1 and they are connected to each other via a plurality of connecting portions 43, the source side electrode terminals 3 and the plurality of contact patterns 42 can be locally brought into contact at the positions where the respective source side electrode terminals 3 of the liquid crystal display panel 1 intersect with a plurality of contact patterns 42 on the contact films 14A for the source side electrode terminals. Accordingly, the source side electrode terminals 3 and the plurality of contact patterns 42 can be reliably brought into contact under a high contact pressure.

Further, since, between columns of the contact patterns 42 on the contact films 14A for the source side electrode terminals, a plurality of connecting portions 43 are disposed at intervals in the direction of arrangement of the source side electrode terminals 3 of the liquid crystal display panel 1, no matter which source side electrode terminals 3 the connecting portions 43 between columns of the contact patterns 42 are located at positions in contact with, the source side electrode terminals 3 can be brought into contact with the contact patterns 42 of the other columns. Accordingly, the source side electrode terminals 3 can be reliably brought in contact with the contact patterns 42 at a plurality of positions.

Figure 16:
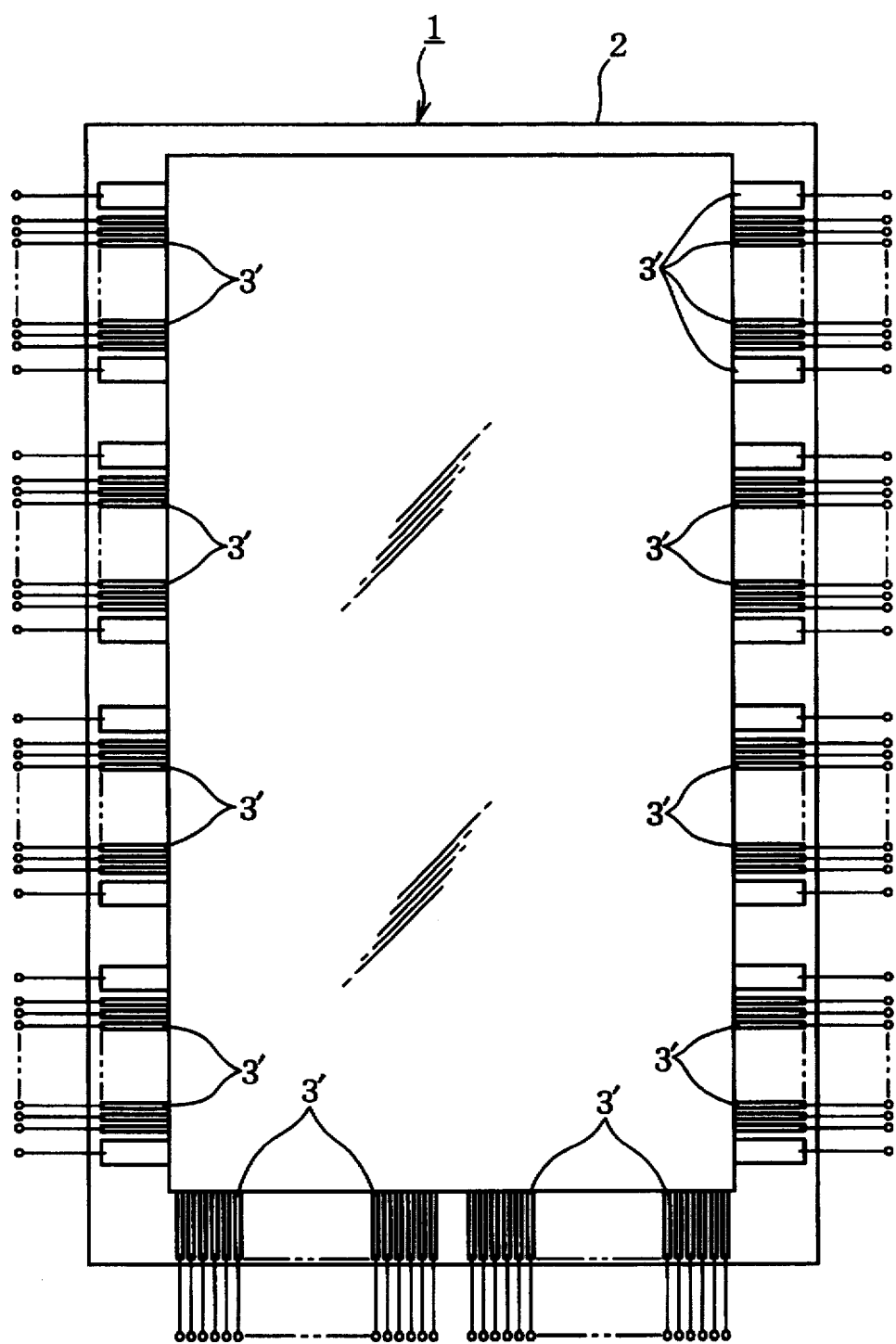
FIG. 16 is a schematic plan view showing an example of the configuration of the liquid crystal display panel mounted on the display panel inspection socket according to a third embodiment of the present invention.

FIG. 16 is a plan view schematically showing an example of the configuration of a TFT type liquid crystal display panel and an example of connection of the signal wiring for inspection. Referring to the same figure, the liquid crystal display panel 1 has a rectangular transparent insulating base plate 2 made of for example a glass. A plurality of source side and gate side electrode terminals 3' are laminated on the transparent insulating base plate 2. Explaining this in further detail, the source side electrode terminals 3' are divided into a plurality of (eight in the illustrated example) groups or blocks and arranged in parallel to each other along the two long sides of the transparent insulating base plate 2. Further, the gate side electrode terminals 3' are divided into a plurality of (two in the illustrated example) groups or blocks and arranged in parallel to each other along one short side of the transparent insulating base plate 2.

Figure 17:
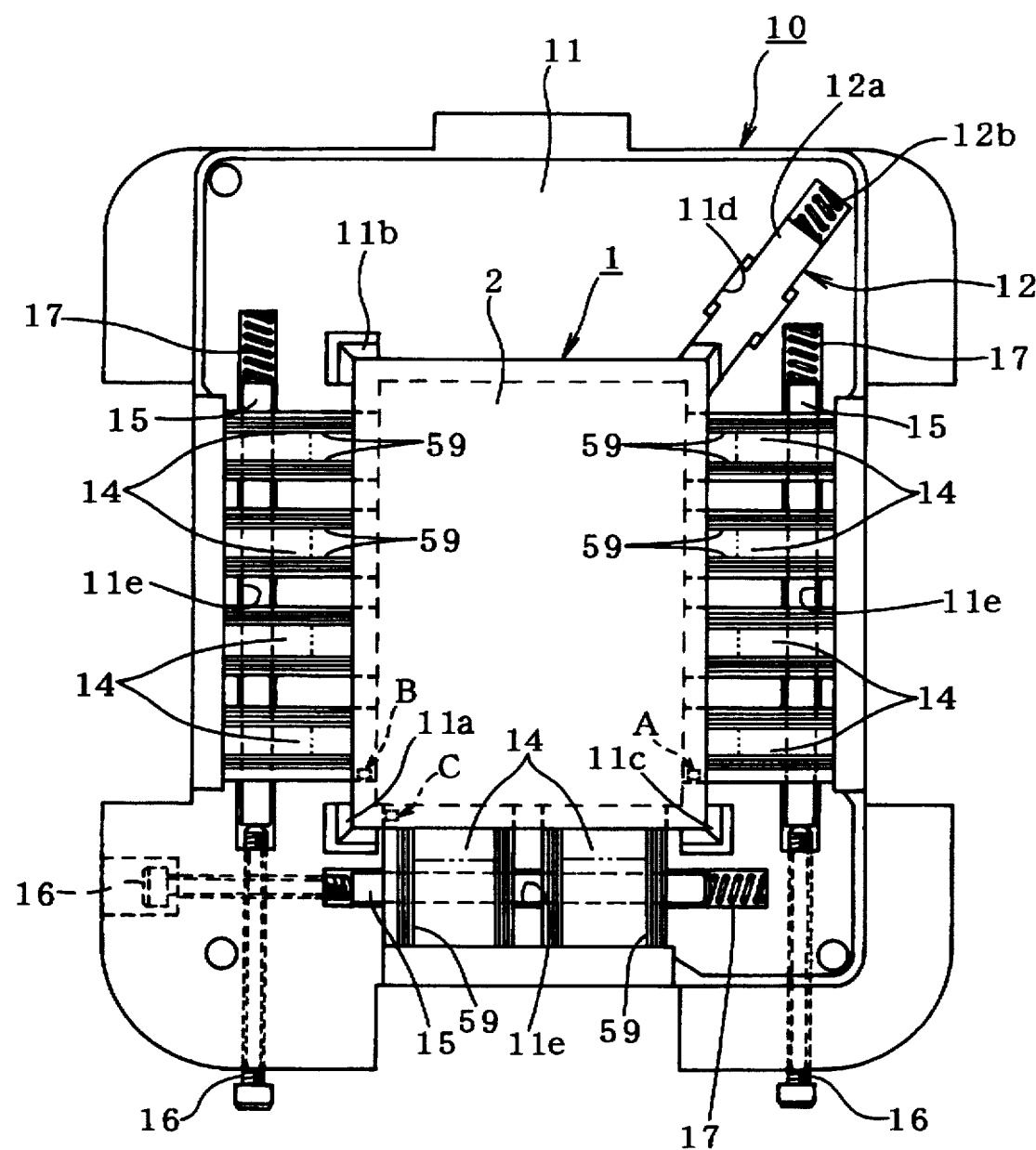
FIG. 17 is a plan view of a state where some of the parts of the display panel inspection socket according to the third embodiment of the present invention are removed.
Figure 18A:
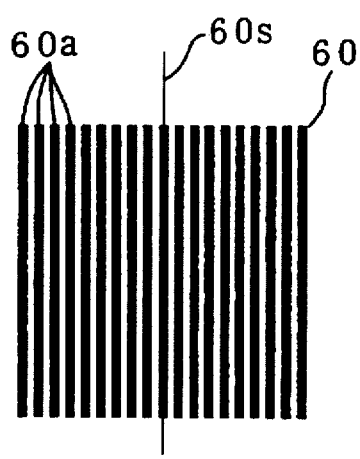
FIGS. 18A and 18B are explanatory views showing an example of the configuration of light shielding patterns formed on the liquid crystal display panel and the contact film of the socket shown in FIG. 17, respectively.
Figure 18B:
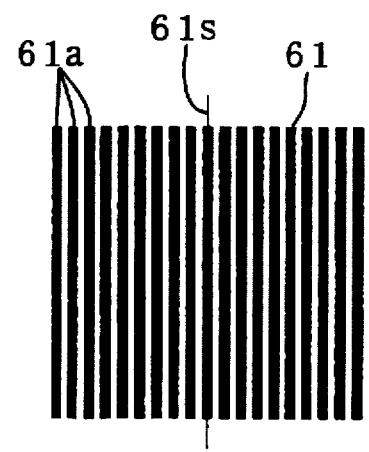
Figure 18C:
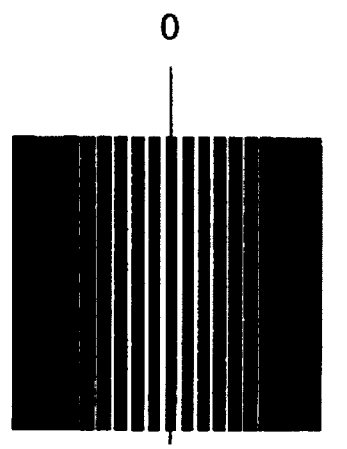
FIGS. 18C to 18G are explanatory views showing a moire stripe pattern appearing in accordance with the relative positions of the two light shielding patterns when the light shielding patterns of FIG. 18A and FIG. 18B are superposed.
Figure 18D:
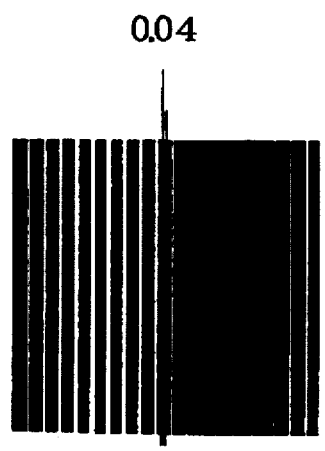
Figure 18E:
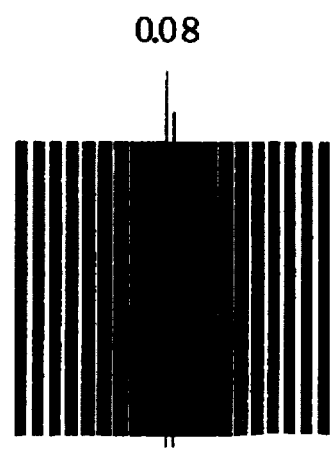
Figure 18F:
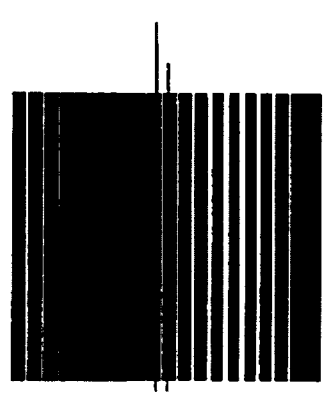
Figure 18G:
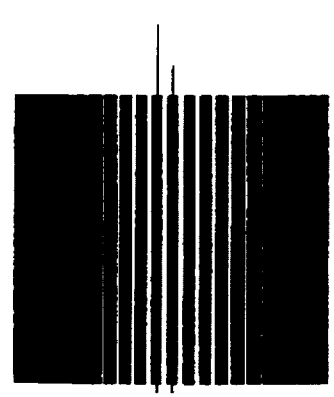

FIG. 17, FIGS. 18A, to 18G show a third embodiment of the present invention where the present invention is applied to a socket for an aging inspection of the liquid crystal display panel shown in FIG. 16. In these figures, the same reference symbols are given to constituent elements similar to those of the first embodiment.

Referring to FIG. 17, corresponding to the long sides and short side of the transparent insulating base plate 2 at which the source side and gate side electrode terminals 3' of the liquid crystal display panel 1 are formed, on the top surface of the socket body 11 of the socket of the third embodiment, recessed grooves 11e are formed extending in parallel to the long sides and short side of the transparent insulating base plate 2. Since the display panel inspection socket of this embodiment is used for an aging inspection, film attachment plates 15 made of an insulating material having almost the same coefficient of linear expansion as that of the transparent insulating base plate 2, for example, the same material as that for the transparent insulating base plate 2, are accommodated in the recessed grooves 11e in their longitudinal directions so that they can slide. Corresponding to the four blocks of the source side electrode terminals 3' at the long sides of the liquid crystal display panel 1, on the top surface of the film attachment plates 15 in parallel to the long sides of the transparent insulating base plate 2, the base ends of a plurality of (four in the illustrated example) contact films 14 are affixed for the source side electrode terminals 3 of the liquid crystal display panel 1 by for example a binder. Similarly, corresponding to the two blocks of the gate side electrode terminals 3 at the short side of the liquid crystal display panel 1, on the top surface of the film attachment plate 15 parallel to the short side of the transparent insulating base plate 2, the base ends of a plurality of (two in the illustrated example) contact films 14 are affixed with respect to the gate side electrode terminals 3' of the liquid crystal display panel 1 by for example a binder. Note that, when the present invention is applied to a contact apparatus for inspecting a liquid crystal display panel under a normal temperature, it is not necessary to make the coefficients of linear expansion of the film attachment plates 15 and the transparent insulating base plate 2 of the liquid crystal display panel 1 coincide with each other.

As shown in FIG. 17, the contact films 14 are made of an insulative flexible film. A plurality of contacts 59 which are individually brought into contact with the electrode terminals 3' of the liquid crystal display panel 1 are laminated on the surface of the front ends thereof.

Further, at the positions of the transparent insulating base plate 2 of the liquid crystal display panel 1 and the contact films 14 exemplified by symbols A, B, and C in FIG. 17, light shielding patterns 60 and 61 for monoaxial adjustment shown in FIGS. 18A and 18B are formed. Here, the light shielding patterns 60 on the transparent insulating base plate 2 on the liquid crystal display panel 1 are formed in the vicinity of the electrode terminals 3' parallel to the electrode terminals 3', and the light shielding patterns 61 on the contact films 14 are formed in the vicinity of the contacts 59 in parallel to the contacts 59. The light shielding patterns 60 on the transparent insulating base plate 2 can be simultaneously formed with the electrode terminals 3' during the formation step of the electrode terminals 3'. Further, the light shielding patterns 61 on the contact films 14 can be simultaneously formed with the contacts 59 during the formation step of the contacts 59.

In the socket of the third embodiment having the above configuration, when the liquid crystal display panel 1 is mounted on the socket body 11 and the transparent insulating base plate 2 thereof is placed on the contact films 14, the electrode terminals 3' on the transparent insulating base plate 2 and the contacts 59 on the contact films 14 are superposed on each other and, at the same time, the light shielding patterns 60 on the transparent insulating base plate 2 and the light shielding patterns 61 on the contact films 14 are superposed on each other. Accordingly, if positional adjustment of the transparent insulating base plate 2 of the liquid crystal display panel 1 is carried out while observing the moire stripe patterns appeared from the light shielding patterns 60 and 61 by the naked eye or the like and the insulating base plate 2 is affixed to the socket body 11 at a position where the moire stripe patterns becomes predetermined patterns, the electrode terminals 3' on the transparent insulating base plate 2 and the contacts 59 on the contact films 14 will be correctly positioned.

Next, an explanation will be made of the preferred method of designing the light shielding patterns 60 and 61 referring FIGS. 19A and 19B.

First, the dimensions of the patterns of the parallel light shielding lines 61a and 62a in the two light shielding patterns 60 and 61 are defined as in FIGS. 19A and 19B, respectively. Note that, $P_1 > P_2$ is assumed here. Where one cycle's worth of a repetition of the bright portion and the dark portion of the moire stripe pattern obtained by superposing these two patterns 60 and 61 appears, the following equation stands:

$$nP_1 = (n+1)P_2 \quad (1)$$

Where m number of cycles of repetitions of the light and darkness appear, it is sufficient so far as both of the patterns 60 and 61 are constituted by m×n parallel lines. For the object of positioning, however, desirably use is made of a pattern in which the bright portion and dark portion appear in about one cycle.

Further, when considering the dimensions of a pattern in which the bright and dark moire stripe pattern clearly appears, ideally the bright portion has extremely little light shielding, and the dark portion is completely light-shielded. The condition for completely shielding the light for the dark portion can be represented by the following equations:

$$C_1 \leq t_2 \quad (2)$$

$$C_2 \leq t_1 \quad (3)$$

Further, in order to reduce the light shielding of the bright portion, it is sufficient so far as $C_1$ and $C_2$ are made large. Here, $P_1 = t_1 + C_1$, and therefore Equation 3 becomes as follows:

$$C_2 \leq P_1 + C_1 \quad (4A)$$

$$C_1 + C_2 \leq P_1 \quad (4B)$$

Further, similarly, since $P_2 = t_2 + C_2$, Equation 2 becomes as follows:

$$C_1 \leq P_2 - C_2 \quad (5A)$$

$$C_1 + C_2 \leq P_2 \quad (5B)$$

Here, from the definition of $P_1 > P_2$, there exists a case where Equations 5A and 5B are not satisfied even if Equations 4A and 4B are satisfied, therefore $C_1$ and $C_2$ will be determined by Equations 5A and 5B. The conditions for satisfying this equation and making $C_1$ and $C_2$ maximum are as follows:

$$C_1 = P_2/2 \quad (6A)$$

$$C_2 = P_2/2 \quad (6B)$$

Accordingly, $$t_2 = P_2/2 \quad (7)$$

Further, from Equation 1, the following stand:

$$n(t_1 + C_1) = (n+1)P_2 \quad (8A)$$

$$t_1 = \{P_2(n+1)/n\} - (C_1/n) \quad (8B)$$

$$t1 = \{P_2(n+1)/n\} - (P_2/2n) \quad (8C)$$

The above are equations for finding the ideal dimensions for making the bright portion and dark portion the clearest, but must be determined by taking the processing precision and assembly error etc. of respective parallel lines into account, therefore this is only one example of the pattern precision.

The light shielding patterns 60 and 61 for the monoaxial adjustment shown in FIGS. 18A and 18B are those of 3 mm square. FIG. 18C shows a moire stripe pattern when the centers 60s and 61s of the two light shielding patterns 60 and 61 are brought into coincidence with each other. Further, FIGS. 18D, 18E, 18F, and 18G show the moire stripe patterns when the centers 60a and 60b of the two light shielding patterns 60 and 61 are deviated to the direction of arrangement of the pattern by 0.04 mm, 0.08 mm, 0.12 mm, and 0.16 mm, respectively. As seen from FIGS. 18C to 18G, in this example, if two light shielding patterns 60 and 61 are deviated by 0.16 mm, the same pattern as that for the first is formed, therefore it is necessary to use the same within an adjustment range narrower than ±0.16 mm. Further, with a state of deviation by 0.08 mm, it is not seen whether it is deviated to the left or right, therefore desirably the adjustment range is less than 0.08 mm.

Further, as clear from FIGS. 18C to 18G, the moire stripe patterns appearing from the light shielding patterns 60 and 61 are patterns of bright and dark stripes having a cyclic pitch greater than the pitch of the light shielding lines 61a and 62a in the light shielding patterns 60 and 61 and shift while changing in widths with respect to a change of the amount of positional deviation between the electrode terminals 3' and the contacts 59, therefore the positional deviation between the electrode terminals 3' and the contacts 59 can be easily confirmed even by the naked eye by observing the moire stripe patterns. Accordingly, by adjusting the position of the liquid crystal display panel 1 or the contact films 14 while observing the moire stripe patterns, the electrode terminals 3 on the transparent insulating base plate 2 of the liquid crystal display panel 1 and the contacts 19 on the contact films 14 can be easily and reliably positioned.

Further, as mentioned above, since the moire stripe patterns appearing by the superposition of the light shielding patterns 60 on the transparent insulating base plate 2 and the light shielding patterns 61 on the contact films 14 are patterns of bright and dark stripes having a cyclic pitch larger than the pitch of the light shielding line 61a and 62a of the light shielding patterns 60 and 61 and shift while changing in widths with respect to a change of the amount of deviation between the electrode terminals 3 and the contacts 19, by detecting the changes of the moire stripe patterns by using an optical sensor etc., it becomes possible to reliably confirm the positional deviation between the electrode terminals 3 and the contacts 19 by a simple detecting device without a necessity of a high precision optical sensor or inspecting circuit.

Accordingly, the positioning between the electrode terminals of the liquid crystal display panel 1 and the contacts 19 arranged on the contact films 14 can be easily and quickly carried out.

Further, in the example of the pattern structure of FIGS. 18A and 18B, since the light shielding patterns 60 are comprised by one type of light shielding lines, when the electrode terminals 3 on the transparent insulating base plate 2 of the liquid crystal display panel 1 are made of an opaque material, it is possible to use the electrode terminals 3 for the light shielding patterns 60 on the liquid crystal display panel side.

Figure 20A:
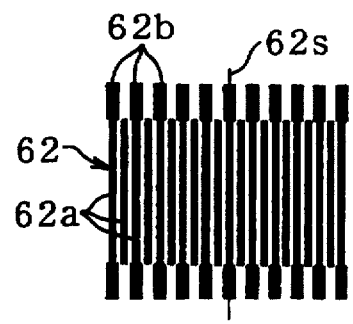
FIGS. 20A and 20B are explanatory views showing another example of the configuration of the light shielding patterns formed on the liquid crystal display panel and the contact film of the socket shown in FIG. 17, respectively.
Figure 20B:
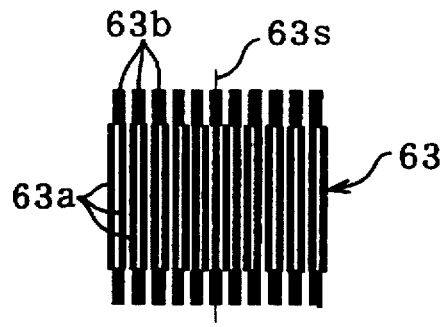

FIGS. 20A and 20B show another example of the configuration of the light shielding patterns for monoaxial adjustment. The light shielding patterns 62 and 63 in the figures have light shielding lines 62a and 63a having the same dimensions as those of the light shielding lines 61a and 62a of the light shielding patterns 60 and 61 of FIGS. 18A and 18B. Further, light shielding lines 62b and 63b having a low sensitivity are formed on the two ends of the light shielding lines 62a and 63a.

Figure 20C:
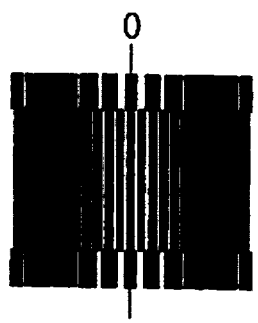
FIGS. 20C to 20I are explanatory views showing a moire stripe pattern appearing in accordance with the relative positions of the two light shielding patterns when the light shielding patterns of FIGS. 20A and 20B are superposed.
Figure 20D:
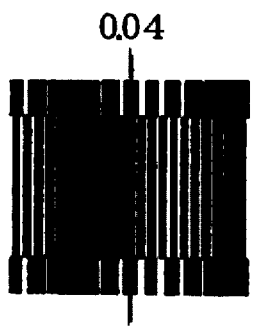
Figure 20E:
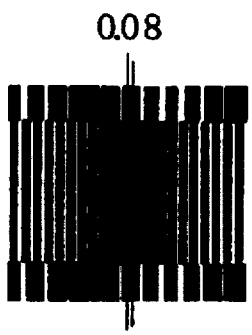
Figure 20F:
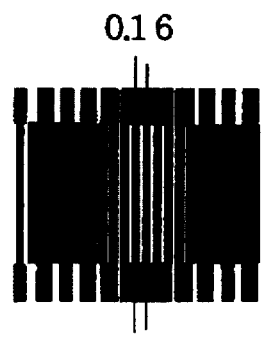
Figure 20G:
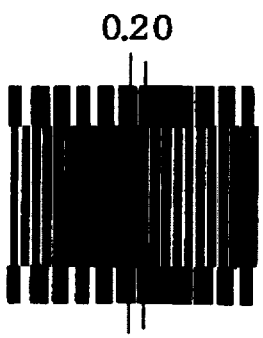
Figure 20H:
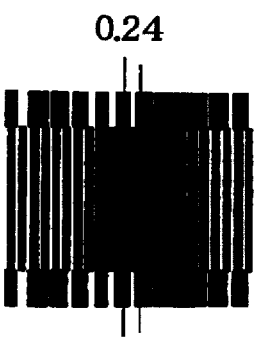
Figure 20I:
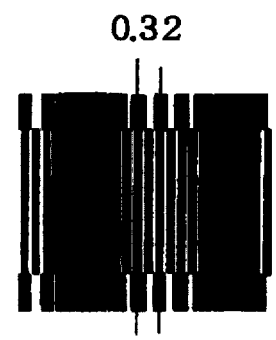

Further, FIG. 20C shows a moire stripe pattern appearing when the centers 62s and 63s of the patterns 62 and 63 are brought into coincidence with each other; and FIGS. 20D to 20I show the change of the moire stripe pattern where the two patterns 62 and 63 are deviated from the state of FIG. 20C by 0.04 mm, 0.08 mm, 0.16 mm, 0.20 mm, 0.24 mm, and 0.32 mm, respectively.

In the example of this configuration, the sensitivity of the light shielding lines 62a and 63a at the two ends is made half of the sensitivity of the inside light shielding lines 62a and 63a. The light shielding patterns 62 and 63 are positioned so that bright portions become single straight lines at the centers 62s and 63s as shown in FIG. 20C. Further, it can be immediately determined to which direction of the left or right should the movement be adjusted if the moire stripe pattern for low sensitivity is seen. Further, the cycle at which bright portions become a single straight line is long, therefore the adjustment range can be made larger than that of the example of FIGS. 18A and 18B. Namely, in this example, the adjustment range becomes less than 0.32 mm.

Figure 21A:
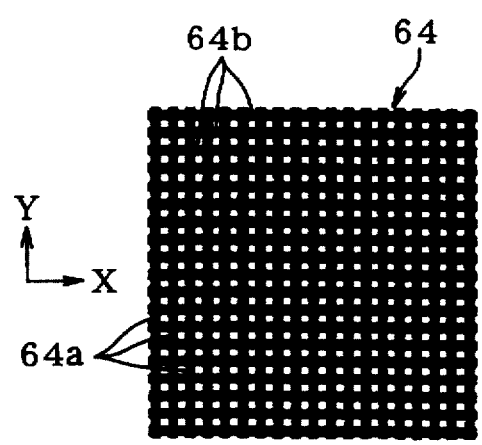
FIGS. 21A and 21B are explanatory views showing another example of the configuration of the light shielding patterns formed on the liquid crystal display panel and the contact film of the contact apparatus shown in FIG. 17, respectively.
Figure 21B:
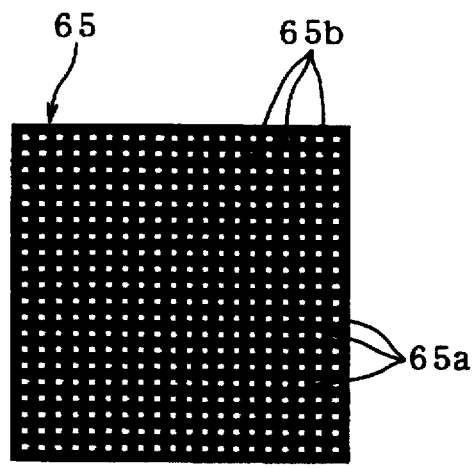
Figure 21C:
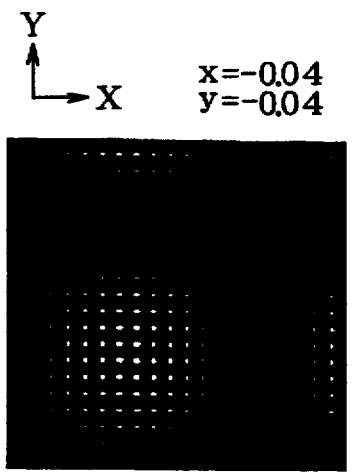
FIGS. 21C to 21E are explanatory views showing a moire stripe pattern appearing in accordance with the relative positions of the two light shielding patterns when the light shielding patterns of FIGS. 20A and 20B are superposed.
Figure 21D:
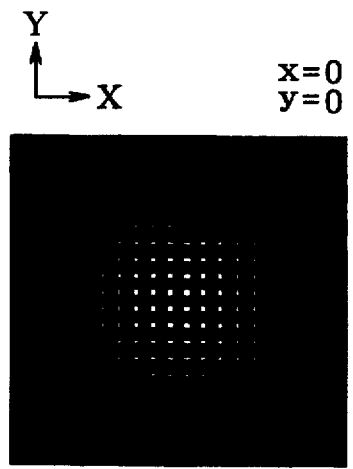
Figure 21E:
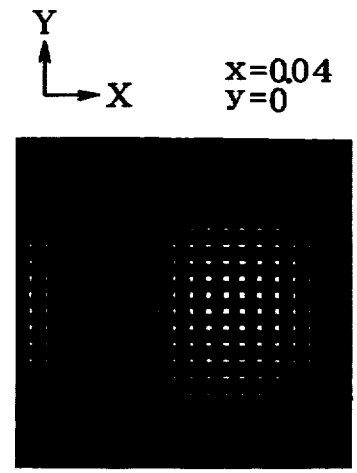

FIGS. 21A and 21B show an example of the configuration of light shielding patterns for biaxial adjustment. The light shielding pattern 64 of FIG. 21A is obtained by arranging the light shielding lines 64a and 64b in the form of a lattice by crossing them in an x-direction and a y-direction. Similarly the light shielding pattern 65 of FIG. 21B is obtained by arrannging the light shielding lines 65a and 65b in the form of a lattice by crossing them. Further, FIG. 21D shows the moire stripe pattern appearing when the centers of the two patterns 64 and 65 are brought into coincidence with each other in both of the x- and y-directions (x=0 and y=0); FIG. 21C shows a moire stripe pattern where the patterns 64 and 65 are deviated in the x-direction by −0.04 mm and in the y-direction by −0.04 mm, respectively; and FIG. 21E shows a moire stripe pattern where the patterns 64 and 65 are deviated in the x-direction only by +0.04 mm (y=0).

The adjustment range by these light shielding patterns 64 and 65 becomes about +0.04 mm in both of the x- and y-directions. Of course, the adjustment range of also these light shielding patterns 64 and 65 can be increased by arranging the light shielding lines for low sensitivity as shown in FIGS. 19A and 19B on the peripheries.

FIG. 22 to FIG. 32E show an embodiment of a case where the present invention is applied to a socket for inspecting a liquid crystal display panel. First, referring FIG. 22 to FIG. 26, the liquid crystal display panel 101 having a schematically rectangular flat surface has an insulating base plate 102 made of for example a glass. A plurality of transparent electrode terminals are arranged in parallel on the bottom surface of this insulating base plate 102 along a long side and short side of the insulating base plate 102. The socket 110 for inspecting a liquid crystal display panel according to this embodiment of the present invention has a socket body 111 having a schematically rectangular flat surface made of a metal or plastic. This socket body 111 is provided with a reference engagement piece 111a to be engaged with a corner of the insulating base plate 102 of the liquid crystal display panel 101. A pressing means 112 for pressing the insulating base plate 102 of the liquid crystal display panel 101 against the reference engagement piece 111a is provided in the socket body 111 opposite to the reference engagement piece 111a in the diagonal direction. This pressing means 112 has a moveable engagement piece 112a to be engaged with a corner of the insulating base plate 102 and a coil spring (not illustrated) biasing this moveable engagement piece 112a in the direction of the reference engagement piece 111a. The spring force of the coil spring is set to a strength that enables allowance of a change in dimensions of the insulating base plate 102 due to linear expansion in the direction of arrangement of the transparent electrode terminals of the insulating base plate 102.

Figure 22:
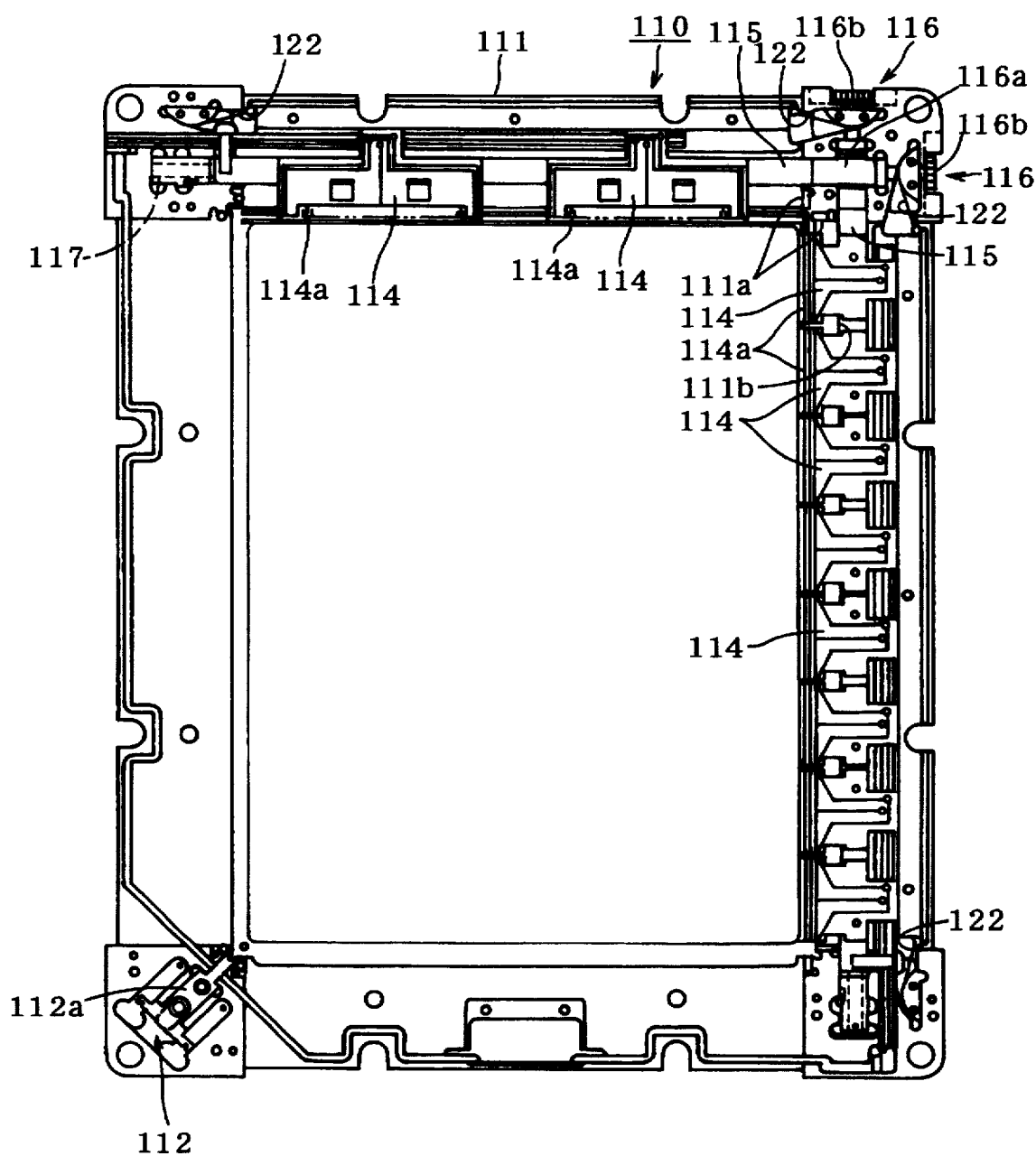
FIG. 22 is a schematic plan view of a halfway assembled state of the socket showing the third embodiment where the present invention is applied to a socket for inspecting a liquid crystal display panel.
Figure 23:
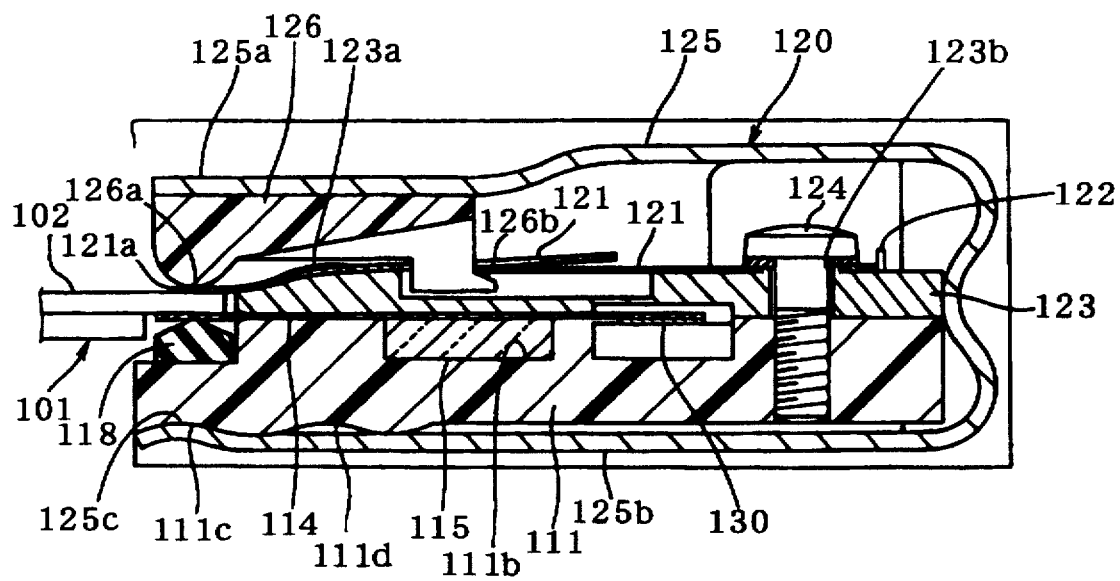
FIG. 23 is a vertical sectional view taken along a line D—D in FIG. 26 showing a state where a clip member of the socket of FIG. 22 is located at the pressing position.

Referring to FIG. 22 and FIG. 23, corresponding to the sides of the insulating base plate 102 of the liquid crystal display panel 101 on which the transparent electrode terminals are formed, recessed grooves 111b extending in parallel to the sides of the insulating base plate 102 are formed in the top surface of the socket body 111. In each recessed groove 111b, a film attachment plate 115 made of an insulating material having almost the same coefficient of linear expansion as that of the insulating base plate 2, for example, the same material as that for the insulating base plate 102, is accommodated so that it can slide in the longitudinal direction thereof. A plurality of contact films 114 are fixed to the top surface of each film attachment plate 115 by for example a binder. Contacts 114a for contact with the transparent electrode terminals of the liquid crystal display panel 101 are formed on the top surface of the contact films 114. In this embodiment, corresponding to the group of transparent electrode terminals of the long side of the liquid crystal display panel 101, eight contact films 114 are disposed in parallel on the film attachment plate 115 for the long side. Corresponding to the group of transparent electrode terminals of the short side of the liquid crystal display panel 101, two contact films 114 are disposed in parallel on the film attachment plate 115 for the short side.

An attachment plate positioning means 116 for positioning one end of the film attachment plate 115 on the same reference surface as one end of the insulating base plate 102 is provided at one end of each recessed groove 111b. This attachment plate positioning means 116 has an abutment piece 116a abutting against one end of the film attachment plate 115 and an adjustment screw 116 for adjusting the position of this abutment piece. Further, a coil spring 117 serving as the attachment plate end pressing means for pressing the film attachment plate 115 against the abutment piece 116a of the attachment plate positioning means 116 is provided on the other end of the recessed groove 111b while abutting against the other end of the film attachment plate 115. The spring force of this coil spring 117 is set to a strength that enables allowance of a change in the dimensions of the film attachment plate 115 due to linear expansion in the direction of arrangement of the lead pattern.

As shown in detail in FIG. 23, elastic supporting members 118 for supporting the front ends of the contact films 114 from the bottom are provided on the socket body 111 so that they resiliently contact the bottom surface of the front ends of the contact films 114. The socket 110 is provided with clip members 120 provided on the socket body 111 so that they can slide so as to press the insulating base plate 102 of the liquid crystal display panel 101 against the contact films 114 when moving to the top surface of the insulating base plate 102 of the liquid crystal display panel 101 mounted on the contact films 114 and with flexible shutters 121 interposed between the clip members 120 and the insulating base plate 102 of the liquid crystal display panel 101 when the clip members 120 press the insulating base plate 102 of the liquid crystal display panel 101.

Springs 122 (refer to FIG. 22 and FIG. 23) biasing the rear ends of the shutters 121 forward are attached to the socket body 111, The shutters 121 can move from the retracting position (refer to FIG. 25) at which the front ends 121a thereof release the display panel mounting region by the biasing force of the spring 122 to the covering position (refer to FIG. 23) at which the front ends 121a cover the top of the insulating base plate 102 of the liquid crystal display panel 101. Supporting plates 123 which cover the top of the contact films 114 and have front ends which extend along the sides of the insulating base plate 102 of the liquid crystal display panel 101 are affixed on the socket body 111 by the screws 124. The shutters 121 are supported on the supporting plates 123 so that they can slide.

As shown in FIGS. 24, 26, and 31A to 31C, a clip member 120 comprises a damper 125 made of metal having a lateral U-shaped cross-section having a spring property mounted on the socket body 111 so as to vertically grip the socket body 111 and the liquid crystal display panel 101 and a sliding piece 126 made of plastic which is attached to the bottom surface of the upper piece 125a over almost the entire length of the upper piece 125a of the damper 125 and brought into sliding contact with the top surface of the shutter 121. In this embodiment, the sliding piece 126 is attached to the damper 125 by screws (not shown), but it is also possible to affix the same to the damper 125 by caulking or a binder. As the plastic material to be used for the sliding piece 126, a material which is rich in lubricity such as polytetrafluoroethylene is preferred.

Accordingly, the clip member 120 of this embodiment can vertically grip the insulating base plate 102 of the liquid crystal display panel 101 and the socket body 111 by the spring force of the damper 125 at the pressing position. The electrode terminals of the liquid crystal display panel 101 and the contacts 114a of the contact films 114 can be brought into contact with each other under a required contact pressure by this gripping force. Further, since the sliding piece 126 made of plastic, which can easily secure a high dimensional precision, is attached to the bottom surface of the upper piece 125a over almost the entire length of the upper piece 125a of the damper 125, even if undulation or warping is generated in the upper piece 125a of the damper 125, this can be corrected. Further, even if undulation or warping slightly remains in the upper piece 125a of the damper 125, the sliding piece 126 made of plastic can easily secure the linearity in the direction of arrangement of the electrode terminals of the liquid crystal display panel 101, therefore the top surface of the insulating base plate 102 of the liquid crystal display panel 101 can be uniformly pressed by the sliding pieces 126 via the shutters 121. Accordingly, the reliability of the contact between the electrode terminals of the liquid crystal display panel 101 and the contacts 114a on the contact films 114 can be enhanced. Further, since the sliding pieces 126 are made of plastic, even if the shutters 121 are made of metal, the generation of metal powder due to wear can be prevented.

Referring to FIGS. 23, 26, 30, and 32A to 32E, the sliding piece 126 has a projection 126a acting as the front end pressing portion of the clip member 120. Further, the sliding piece 126 is provided with a fitting portion 126b to be fitted with the engagement portion 121b (refer to FIG. 30) of the shutter 121 when the front end pressing portion 126a of the clip member 120 retracts from the pressing position (refer to FIG. 23) for pressing the insulating base plate 102 of the liquid crystal display panel 101 to the releasing position (refer to FIG. 24) for releasing the display panel mounting region. When the clip member 120 is further retracted from the releasing position, the shutter 121 is moved from the covering position to the retracting position by the fitting portion 126b against the biasing force of the spring 122.

As shown in FIGS. 26 and 29A to 29C, a projecting guide 123a (refer to FIG. 26) which abuts against the bottom surface of the front end of the clip member 120 when the panel pressing member 120 moves between the releasing position and the retracting position and spaces the clip member 120 from the top surface of the contact film 114 is provided at the top surface of the supporting plate 123 so as to be projected therefrom. Further, on the top surface of the supporting plate 123, a plurality of boss portions 123b into which the screws 124 are inserted are provided so as to be projected therefrom. The projecting guide 123a and the boss portions 123b of the supporting plate 123 are engaged with long holes 121c and 121d (refer to FIG. 30) formed in the shutter 121 so that they can slide. The shutter 121 can move forward to the covering position by the abutment of the rear end of the long hole 121d against the boss portion 123b of the supporting plate 123.

Figure 26:
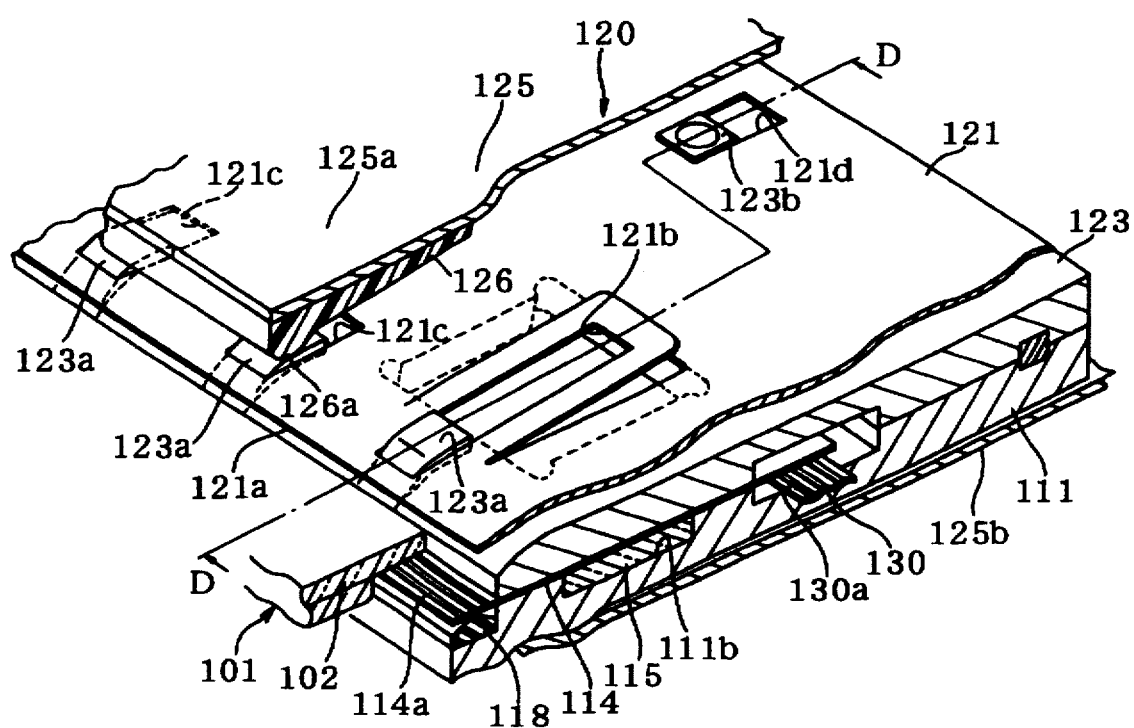
FIG. 26 is a partially sectional perspective view of the principal parts of the socket of FIG. 22.

Further, as seen from FIGS. 23, 26, and 29, the top surface of the supporting plate 123 has almost the same height as that of the top surface of the side of the insulating base plate 2 of the liquid crystal display panel 101 at the front end 123c coming into close contact with the side of the insulating base plate 102 of the liquid crystal display panel 101 to be mounted on the contact films 114 and inclined downward more gently as it goes from the vicinity of the front end of the supporting plate 123 toward the front end 123c.

Figure 24:
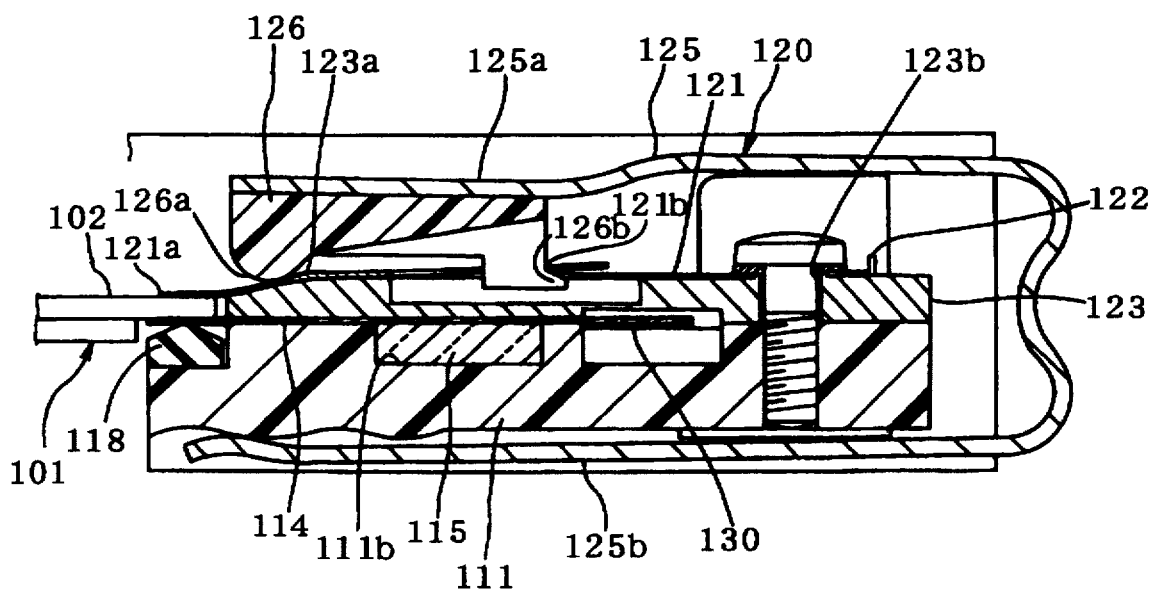
FIG. 24 is a vertical sectional view similar to FIG. 23 showing a state where a clip member of the socket of FIG. 22 is located at the releasing position.
Figure 25:
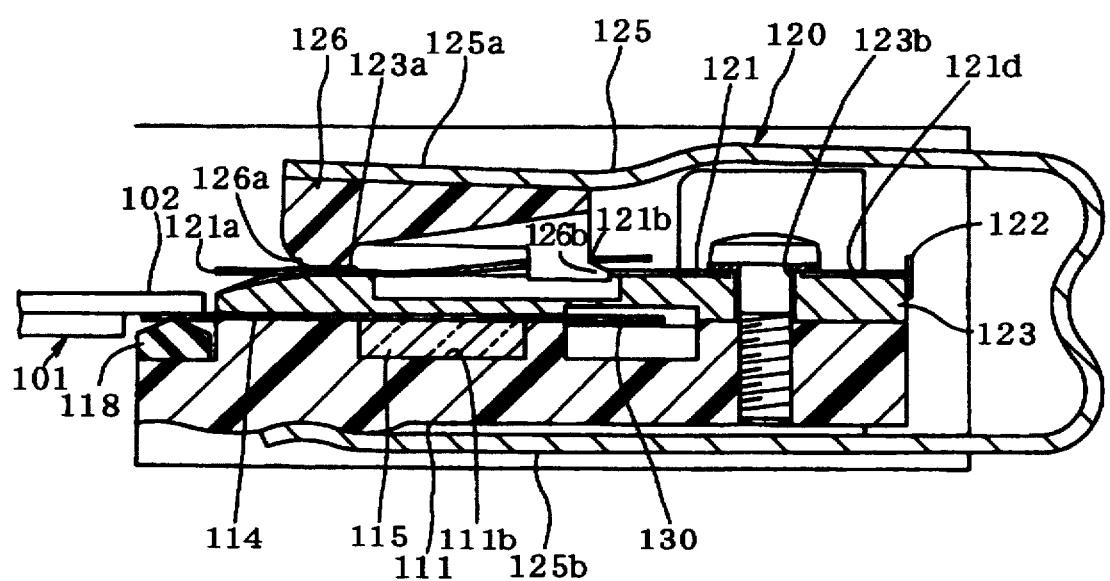
FIG. 25 is a vertical sectional view similar to FIG. 23 showing a state where a clip member and shutter of the socket of FIG. 1 are located at the retracting position.

Further, in this embodiment, as shown in FIGS. 23 to 25, the upward projection 125c is formed by bending the front end of the lower piece 125b of the damper 125. Hollow portions 111c and 111d which are resiliently engaged with the projection 125c of the damper 125 when the clip member 120 is located at the pressing position (FIG. 23) and the retracting position (FIG. 25), respectively are formed on the bottom surface of the socket body 111. Accordingly, the clip member 120 can be stably fitted at the pressing position and the retracting position, respectively. Note that, preferably the sliding motion of the damper 125 is carried out by using a jig (not illustrated)

In the socket 110 for inspecting a display panel having the above configuration, due to the sliding motion of the clip members 120, the liquid crystal display panel 101 can be pressed against the top of the contact films 114, therefore a reduction of weight and a reduction of size of the entire socket are possible. Further, when the clip members 120 are further retracted from the releasing position, the fitting portions 126b of the clip members 120 move the shutters 121 from the covering position (FIG. 2, FIG. 24) to the retracting position (FIG. 25) against the biasing force of the springs 122, therefore it is possible to prevent the clip members 120 and the shutters 121 from obstructing the attachment and detachment of the liquid crystal display panel 101 when it is attached or detached. Further, after the liquid crystal display panel 101 is mounted, when the clip members 120 are moved from the retracting position (FIG. 25) to the pressing position, during the period when the clip members 120 move from the retracting position to the intermediate releasing position (FIG. 24), the shutters 121 move from the retracting position (FIG. 25) to the covering position (FIG. 24) where the front ends thereof cover the top of the insulating base plate 2 of the liquid crystal display panel 101 by the biasing force of the springs 122, therefore when the clip members 120 move from the releasing position (FIG. 24) to the pressing position (FIG. 23) after this, the bottom surface of the front ends of the clip members 120 will move while sliding on the top surface of the shutters 121 held at the covering position. Accordingly, the clip members 120 will not come into direct contact with the top surface of the liquid crystal display panel 101 and therefore abrasion due to the clip members 120 can be prevented from occurring on the top surface of the liquid crystal display panel 101. Further, since the clip members 120 perform sliding motion by sliding on the top surface of the shutters 121 held at the covering position, the liquid crystal display panel 101 can be prevented from being pushed and moved by the clip members 120 in the same direction as the sliding direction thereof. Accordingly, positional deviation between the electrode terminals of the liquid crystal display panel 101 and the contacts 114a on the contact films 114 can be prevented. Further, the shutters 121 can be moved to the outside of the display panel mounting region by their sliding motion and it is not necessary to generate a large warping in the shutters 121, therefore the durability of the shutters 121 is improved and, at the same time, the apprehension of unintentionally deforming the shutters 121 at the attachment and detachment of the liquid crystal display panel 101 is eliminated.

Further, in the socket 110 having the above configuration, when the clip members 120 move between the releasing position (FIG. 24) and the retracting position (FIG. 25), the shutters 121 move between the covering position and the retracting position linked with the clip members 120, but during the movement of the shutters 121, the projecting guides 123a provided on the supporting plates 123 abut against the bottom surface of the front ends of the clip members 120 and space the clip members 120 from the top surface of the contact films 114a, therefore the shutters 121 can be easily slid without the pressing force of the clip members 20 acting upon the shutters 121. Further, in the socket 110 having the above configuration, as mentioned above, the top surfaces of the supporting plates 123 have almost the same height as that of the top surface of the sides of the liquid crystal display panel 101 at the front end 123c thereof and the top surfaces of the supporting plates 123 are inclined downward more gently as they go from the vicinity of the front ends of the supporting plates 123 toward the front ends 123c, therefore when the clip members 120 are moved forward from the releasing position to the pressing position, the clip members 120 can be smoothly moved forward while pressing the top surfaces of the shutters 121 covering the top surfaces of the supporting plates 124 which are gently inclined downward and the top surfaces of the sides of the liquid crystal display panel 101 by the bottom surface of the front ends of the clip members 120.

Further, in the socket 110 having the above configuration, since elastic supporting members 118 which extend in the direction of arrangement of the contacts 114a of the contact films 114 and resiliently support the bottom surface of the front ends of the contact films 114 from beneath are provided in the socket body 111, when the insulating base plate 102 of the liquid crystal display panel 101 is pressed by the bottom surfaces 126a of the front ends of the clip members 120, part of each contact on the contact films 114 can be reliably pressed against the electrode terminals on the insulating base plate 102 by the elastic supporting members 118 from the bottom surface of the contact films 114. Accordingly, the electrical connection between the electrode terminals of the liquid crystal display panel 101 and the contacts of the contact films 114 can be more reliably carried out.

Further, in the socket 110 having the above configuration, as mentioned above, since the contact films 114 are affixed to the film attachment plates 115 having almost the same coefficient of linear expansion as that of the insulating base plate 102 of the liquid crystal display panel 101 and the socket body 111 is provided with an engagement piece (base plate positioning means) 111a for positioning one end of the insulating base plate 102 in the direction of arrangement of the electrode terminals of the liquid crystal display panel 101, a base plate end pressing means 112 for pressing the other end of the insulating base plate 102 against the engagement piece 111a by a strength that enables allowance of a change in dimensions of the insulating base plate 2 due to linear expansion in the direction of arrangement of the electrode terminals, an attachment plate positioning means 116 for positioning one end of the film attachment plates 115 in the direction of arrangement of the contacts on the same reference surface as one end of the insulating base plate 102, and coil springs (attachment plate end pressing means) 117 for pressing the other end of the film attachment plates 115 against the attachment plate positioning means 116 by a strength which enables allowance of a change in dimensions of the film attachment plates 115 due to linear expansion in the direction of arrangement of the contacts, when the insulating base plate 2 of the liquid crystal display panel 1 is mounted on the contact films 114 of the socket body 111, by performing the positioning by abutting one end of the insulating base plate 102 against the engagement piece 111a, the electrode terminals of the liquid crystal display panel 101 and the contacts of the contact films 114 can be correctly positioned. Then, where the temperature of the inspection environment of the socket on which the liquid crystal display panel 101 is mounted changes, ends of the film attachment plates 115 and one end of the insulating base plate 102 of the liquid crystal display panel 101 can be held on the same reference surface by the engagement piece 111a and the attachment plate positioning means 16 and, at the same time, the amount of dimensional change due to the linear expansion of the insulating base plate 102 and the film attachment plates 115 can be held almost the same in the direction of arrangement of the electrode terminals and the contacts, therefore the positional deviation between the electrode terminals and the contacts of the contact films 114 due to the linear expansion of the insulating base plate 102 and the film attachment plates 115 can be prevented. Accordingly, the transparent electrode terminals of the liquid crystal display panel 101 and the contacts of the contact films 114 can be respectively reliably held in the electrical connection state under a wide range of temperature environments, therefore the inspection of the quality of the display of the liquid crystal display panel 101 can be correctly carried out under a wide range of temperature environments.

Figure 27A:
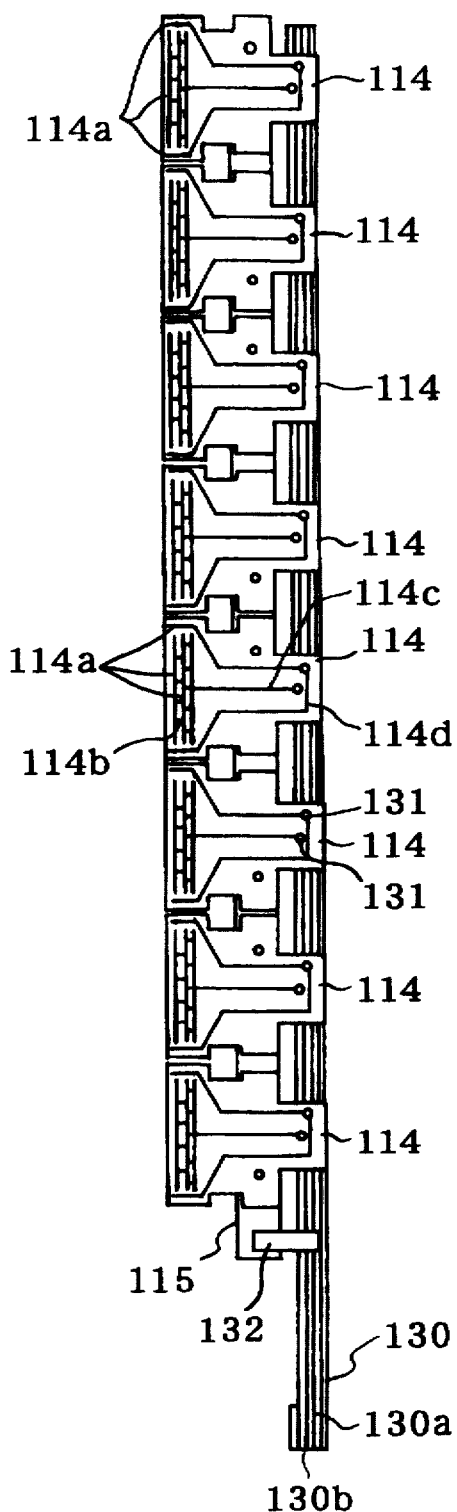
FIG. 27A is a schematic plan view showing a connecting structure of the contact films connected to the source side electrode terminals of the liquid crystal display panel and the flexible printed circuit board.
Figure 27B:
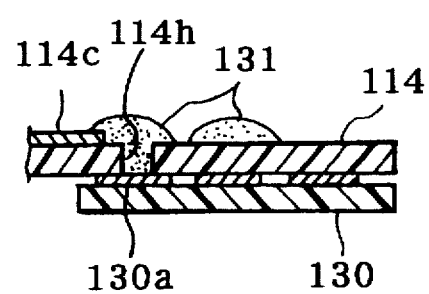
FIG. 27B is an enlarged plan view of the principal parts of the flexible printed circuit board of FIG. 27A.

Next, an explanation will be made of the connecting configuration of the contact films 114 and the flexible printed circuit board used in the above embodiments referring to FIGS. 27A and 27B and FIG. 28.

As mentioned above, each contact film 114 is affixed on a film attachment plate 115 by a binder or the like. Then, a plurality of contacts 114a to be brought into contact with the source side electrode terminals of the liquid crystal display panel 101 are formed on the top surface of the front end of each source electrode use contact film 114 shown in FIG. 27A. The plurality of contacts 114a are arranged in a direction orthogonal to the direction of arrangement of the source side electrode terminals of the liquid crystal display panel 101 and extend in parallel to the direction of arrangement of the gate side electrode terminals 103. They are connected to each other via a plurality of connecting portions 114b. One of the contacts 114a is connected to a lead pattern 114c. Further, on the top surface of each of the contact films 114, two common-electrode use contacts 114a to be brought into contact with the common electrode terminals of the liquid crystal display panel 101 are formed. Each common-electrode use contact 114 is connected to the lead pattern 114d. Further, in the soure electrode use contact films 114e of this embodiment, a plurality of connecting portions are arranged in the direction of arrangement of the source side electrode terminals of the liquid crystal display panel 101 with a clearance between the columns of the source electrode use contacts 114.

Figure 28:
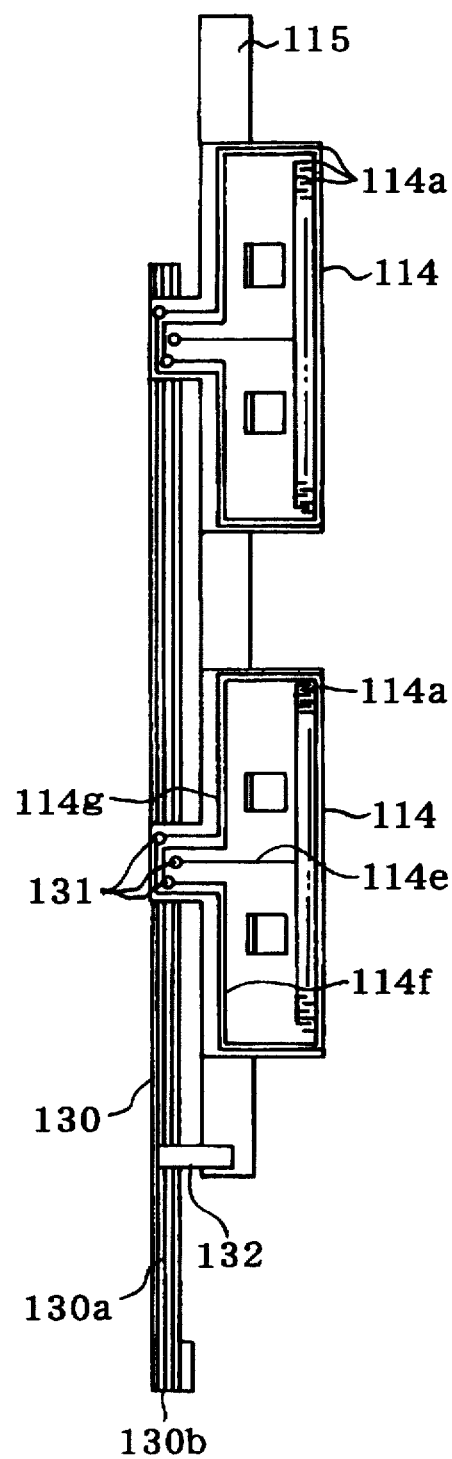
FIG. 28 is a schematic plan view showing the connecting structure of the contact films connected to the gate side electrode terminals of the liquid crystal display panel and the flexible printed circuit board.
Figure 29C:
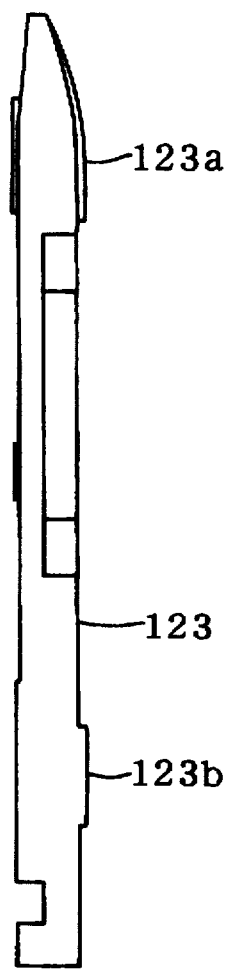
FIGS. 29A, 29B, and 29C are a plan view, a bottom view, and an enlarged side view of a supporting plate, respectively.
Figure 29B:
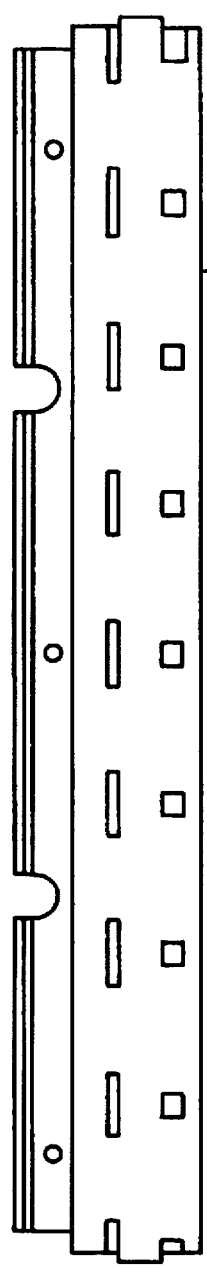
Figure 29A:
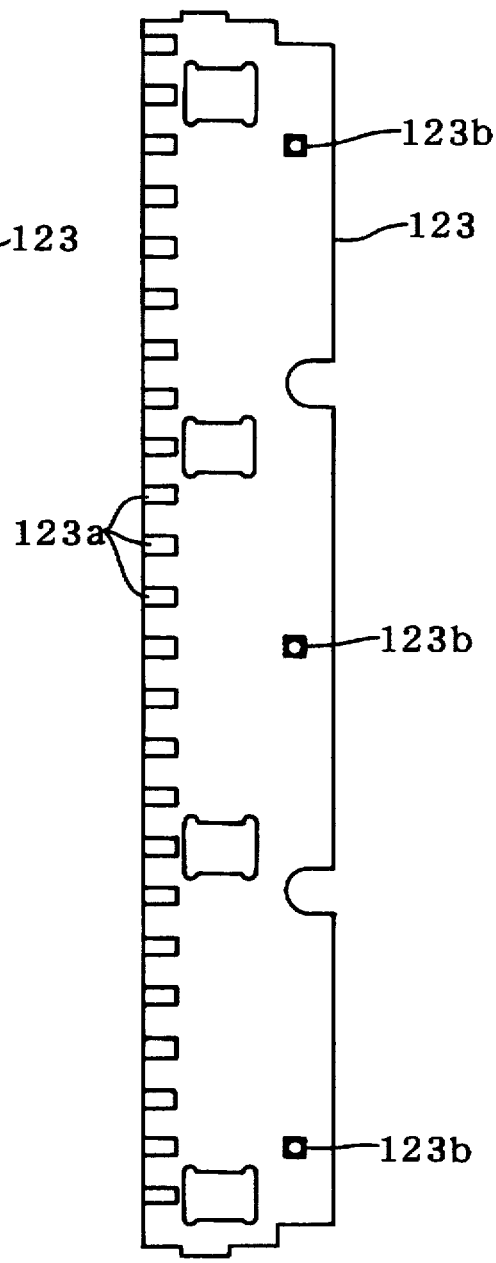
Figure 30:
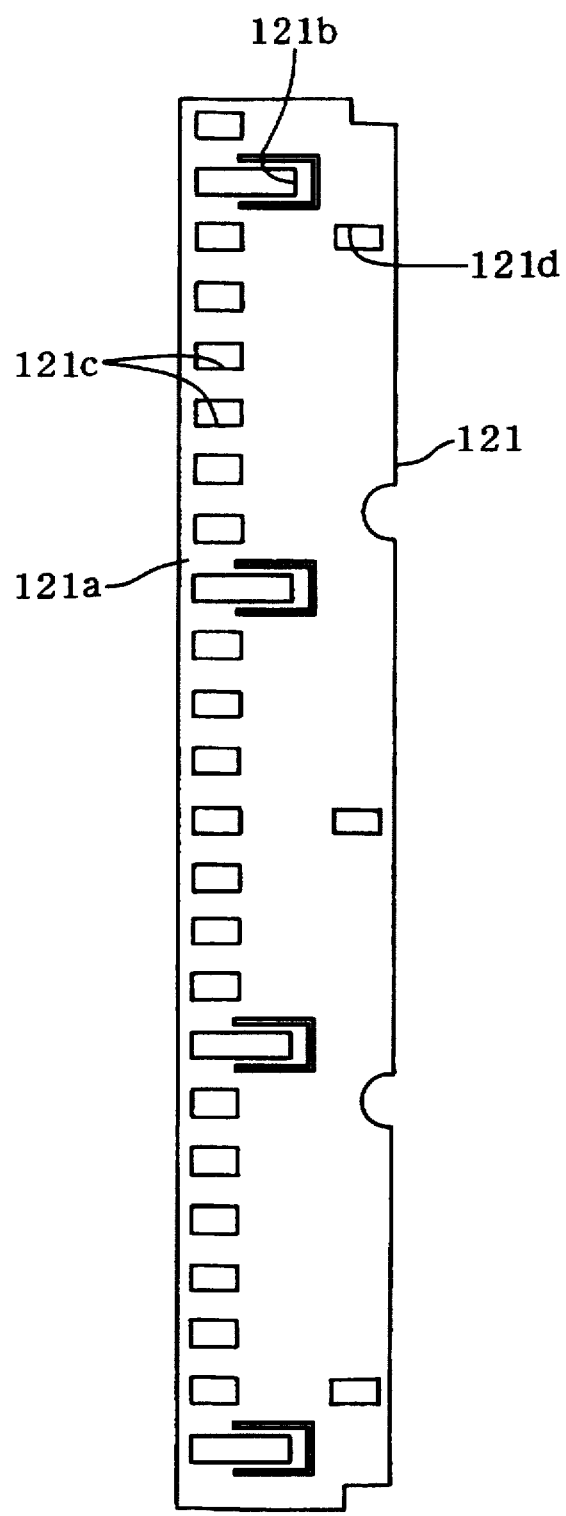
FIG. 30 is a plan view of a shutter.

On the other hand, as shown in FIG. 28, on the top surface of the front end of each gate electrode use contact film 114, a plurality of contacts 114a to be brought into contact with the gate side electrode terminals of the liquid crystal display panel 1 are formed. The plurality of contacts 114a are arranged in the same direction as the direction of arrangement of the gate side electrode terminals of the liquid crystal display panel 101. The contacts of the odd number columns and the contacts of the even number columns are connected to each other on one end side and the other end side of the pattern, respectively, and formed in a comb tooth shape. Further, the contacts 114a of the odd number columns and even number columns are connected to the lead patterns 114e and 114f, respectively. Further, on the top surface of each of the gate electrode use contact films 114, two common-electrode use contacts 114a to be brought into contact with the common electrode terminals of the liquid crystal display panel 101 are formed. Each common-electrode use contact 114a is connected to the lead pattern 114g. Further, on the top surface of the front end of the each gate electrode use contact film 114, an insulating coating film (not shown) coating the connecting region on one end side and the other end side of the contact 114 is formed.

In order to connect each lead pattern of the contact films 114 to an outside circuit device (not shown) providing the pixel driving IC, the flexible printed circuit board 130 is used. As shown in FIG. 27B, on the top surface of the flexible printed circuit board 130 connected to the source electrode use contact films 114, a wiring pattern 130a for connection to the lead patterns 114c and 114d of the contact films 114 is formed. At the positions where this wiring pattern 130a and the lead patterns 114c and 114d of the contact films 114 are superposed, small holes 114h are made in the contact films 114. The lead patterns 114c and 114d and the wiring pattern 130a of the flexible printed circuit board 130 are electrically connected by solder 131 provided so as to fill the small holes 114h. Further, the flexible printed circuit board 130 is held on the contact films 114 by the above soldering. Then, on the film attachment plates 115, wiring plate attachment members 132 for holding the flexible printed circuit board 130 are attached. Although not shown, a connector is attached to the free end of the flexible printed circuit board 130, and the socket connected to this connector is installed in the socket body 111.

Note that, although a detailed explanation is omitted, the connecting configuration of the gate electrode use contact films 114 and the flexible printed circuit board 130 shown in FIG. 28 is similar to the connecting configuration of the source electrode use contact films 114 and the flexible printed circuit board 130 mentioned above.

According to the connecting configuration of the source electrode use contact films 114 and the flexible printed circuit board 130 having the above configuration, the lead patterns 114c and 114d complexly wired on the top surface of the contact films 114 and the wiring pattern 130a of the flexible printed circuit board 130 can be easily connected. Further, since the flexible printed circuit board 130 is held at the film attachment plates 115 together with the contact films 114, even in a case where it is used for the inspection of aging, etc., there is no apprehension of peeling of the contact films 114 and the flexible printed circuit board 130 due to an influence of the linear expansion.

FIG. 33 shows an example of a modification of the damper 125 made of metal of the clip member 120. A plurality of slits 125d extending in a direction orthogonal to the direction of arrangement of the electrode terminals of the liquid crystal display panel 101 are formed in the upper piece 125a of this damper 125.

Where slits 125d extending in the direction orthogonal to the direction of arrangement of the electrode terminals of the liquid crystal display panel 101 are formed in the upper piece 125a of the damper 125 made of metal in this way, when the damper 125 made of metal is formed by the bending of a metal plate, the strain of the upper piece 125a of the damper 125 can be absorbed by the slits 125d. Accordingly, it is possible to effectively suppress undulation or warping along the direction of arrangement of the electrode terminals of the liquid crystal display panel 101 from being generated in the upper piece 125a of the damper 125. Accordingly, when the top surface of the liquid crystal display panel 101 is pressed by the spring force of the dampers 125 via the flexible shutters 121, a uniform pressing force can be given along the direction of arrangement of the electrode terminals of the liquid crystal display panel 101, and therefore the respective electrode terminals of the liquid crystal display panel 101 and the contacts 114a of the contact films 114 can be brought into contact with a uniform contact pressure.

Further, since the slits 125d of the damper 125 shown in FIG. 33 are formed away from the front end of the upper piece 125a of the damper 125, the linearity of the front end of the upper piece 125a can be more easily secured than with the division of the front end of the upper piece 125a of the damper 125 in the direction of arrangement of the electrode terminals of the liquid crystal display panel 101 by the slits.

Figure 34:
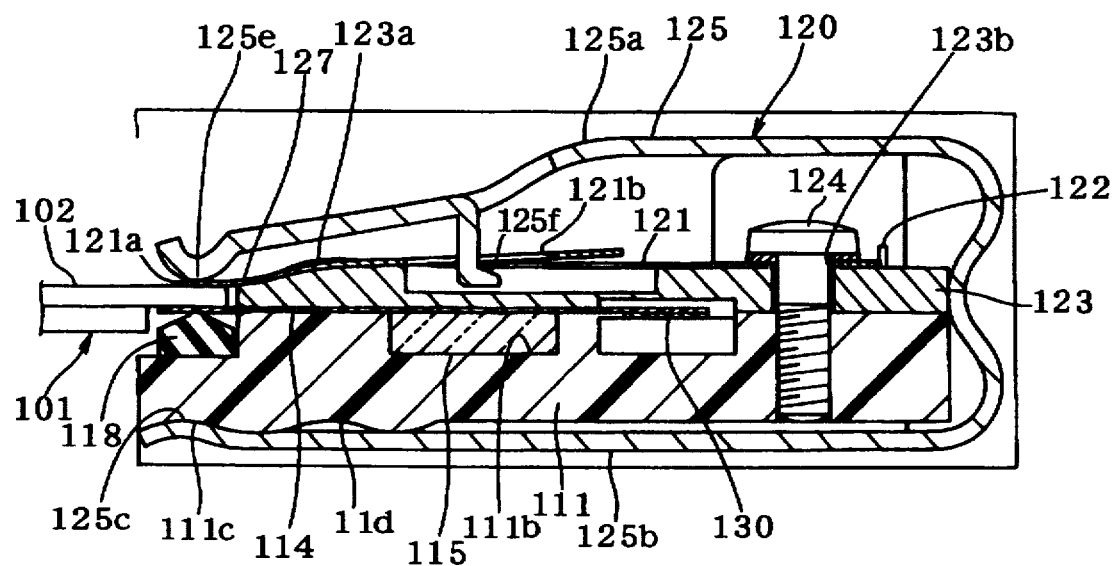
FIG. 34 is a vertical sectional view of the principal parts similar to FIG. 23 of the socket for inspecting a liquid crystal display panel showing another embodiment of the present invention.
Figure 35A:
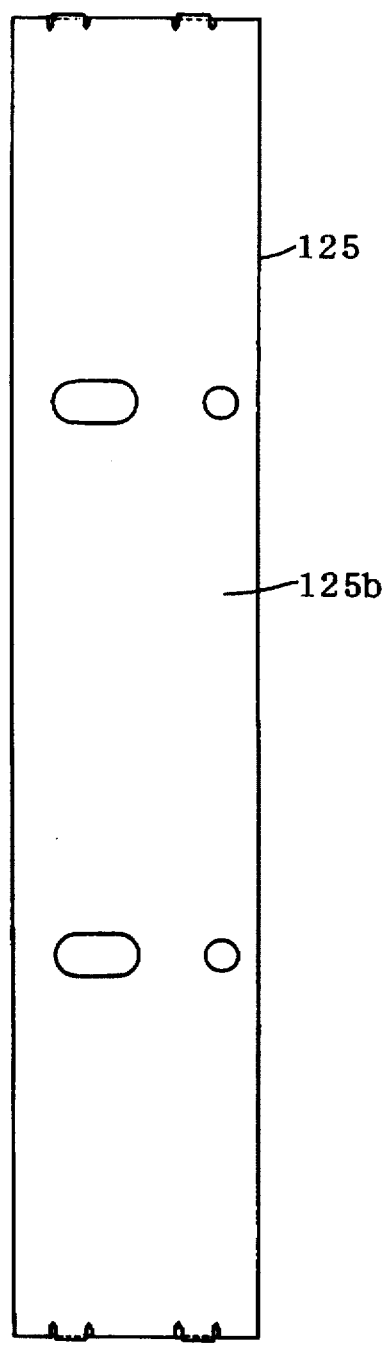
FIGS. 35A, 35B, and 35C are a bottom view, a plan view, and a side view of the clamper of a clip member used in the socket of FIG. 34, respectively.
Figure 35B:
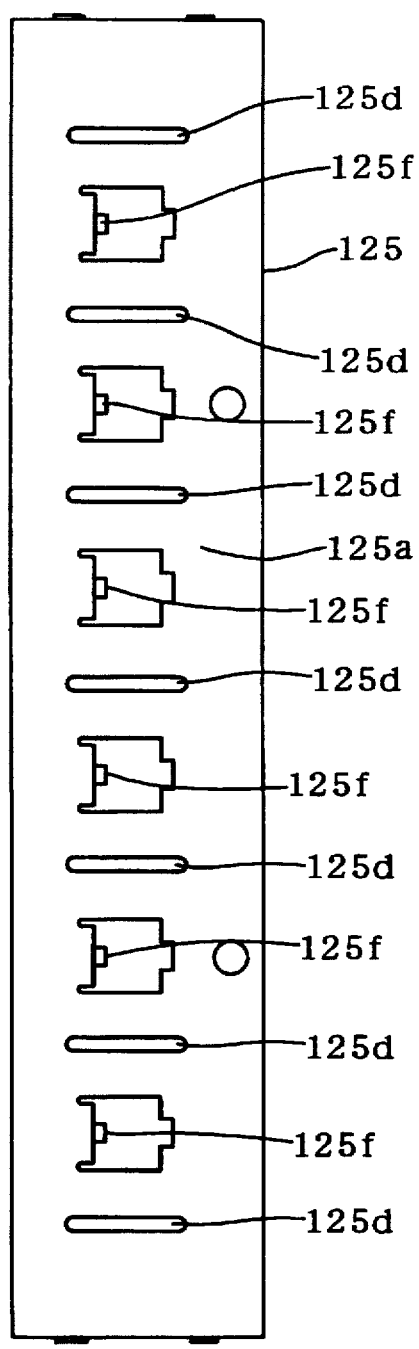
Figure 35C:
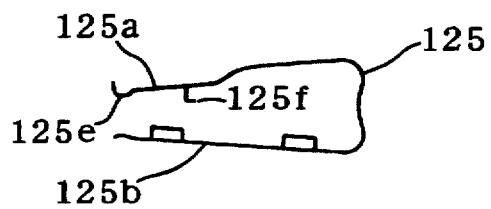
Figure 36A:
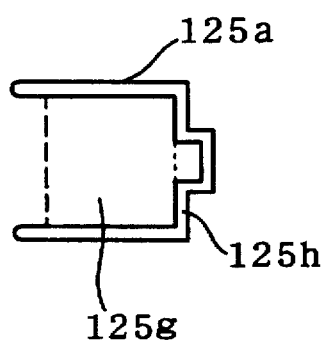
FIGS. 36A and 36B are plan views of principal parts for explaining the method of forming a fitting portion of the clamper shown in FIG. 35.
Figure 36B:
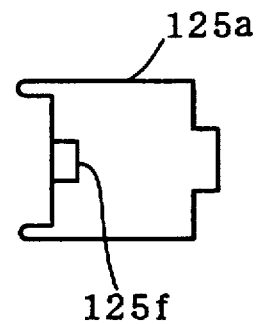

FIG. 34 and FIG. 35 show a fifth embodiment of the present invention. In these figures, the same reference numerals are given for the same constituent elements as those of the above embodiments. In this embodiment, a sliding contact portion 125e brought into sliding contact with the top surface of the shutter 121 is formed and bent downward at the front end of the upper piece 125a of the damper 125. The sliding contact portion 125e is curved downward in a convex shape. Further, the shutter 121 is made of a metal plate, and a coating 127 of resin is applied to the top surface thereof. Further, also in this embodiment, the slits 125d of the upper piece 125a of the damper 125 are formed away from the front end of the upper piece 125a of the damper 125. Further, in this embodiment, the clip member 20 does not have the sliding piece 26 of the above embodiments, therefore the upper piece 125a of the damper 125 is provided with a fitting portion 125f to be fit with the engagement portion 121b of the shutter 121 when the sliding contact portion 125e of the damper 125 retracts from the pressing position (refer to FIG. 34) for pressing the insulating base plate 2 of the liquid crystal display panel 1 to the releasing position for releasing the liquid crystal display panel mounting region. This fitting portion 125f can be easily formed integrally with the upper piece 125a of the damper 125 by forming a small piece 125g acting as the fitting piece 125f by forming a slit 125h in the upper piece 125a of the damper 125 and then bending this small piece 125g at the position indicated by a broken line in FIG. 36A. The rest of the configuration is the same as that of the above embodiments.

Accordingly, also in this embodiment, since a slit 125d extending in the direction orthogonal to the direction of arrangement of the electrode terminals of the liquid crystal display panel 101 is formed in the upper piece 125a of the damper 125 made of metal having a lateral U-shaped cross section vertically gripping the liquid crystal display panel 101 and the socket body 111, when the damper 125 made of metal is formed by bending of a metal plate, the strain of the upper piece 125a of the damper 125 can be absorbed by the slit 125d, whereby it is possible to effectively suppress undulation or warping along the direction of arrangement of the electrode terminals of the liquid crystal display panel 101 from being generated in the upper piece 125a of the damper 125.

Further, since the slit 125d extending in the direction orthogonal to the direction of arrangement of the electrode terminals of the liquid crystal display panel 101 is formed away from the front end of the upper piece portion 125a of the damper 125, it is easier to secure the linearity of the front end of the upper piece 125a than in the case of the division of the front end of the upper piece 125a of the damper 125 in the direction of arrangement of the electrode terminals of the liquid crystal display panel 101 by the slit 125d.

Further, since the sliding contact portion 125e brought into sliding contact with the top surface of the shutter 121 is formed by bending downward the front end of the upper piece 125a of the damper 125 made of the metal, it is possible to more effectively prevent undulation or warping from being generated in the upper piece 125a of the damper 125 and, at the same time, the number of the parts of the panel pressing member 120 can be decreased.

We claim:

1. A display panel inspection socket comprising:
   a socket body for holding a display panel wherein a large number of electrode terminals are arranged at sides of a surface of an insulating base plate;
   a film attachment plate, attached to the socket body in a way that positional adjustment thereof can be carried out along a direction of arrangement of the electrode terminals of the display panel;
   contact films attached to the socket body via the film attachment plates and provided with contacts for contact with the electrode terminals of the display panel on the surface;
   an elastic supporting member which is attached to the socket body and extends along a direction of arrangement of the electrode terminals of the display panel and supports the back surfaces of the contact films; and
   a clip member which is mounted on one side of the socket body so as to grip the socket body and the insulating base plate of the display panel and is mounted to slide between a pressing position for pressing the back surface of the insulating base plate of the display panel and a releasing position for releasing the display panel.

2. A display panel inspection socket according to claim 1, further comprising a supporting plate having a guide surface which is substantially continuous with the back surface of the insulating base plate of the display panel provided at the socket body.

3. A display panel inspection socket according to claim 2, further comprising a protecting film to be interposed between the back surface of the insulating base plate of the display panel and one side of the clip member, provided on the guide surface of the supporting plate.

4. A display panel inspection socket according to claim 3, wherein the protecting film is formed so as to move from a position at which the front ends thereof cover the back surface of the insulating base plate of the display panel to a position for releasing the display panel when the clip member moves from the pressing position to the releasing position.

5. A display panel inspection socket according to claim 4, wherein the film attachment plate has substantially the same coefficient of linear expansion as the insulating base plate of the display panel.

6. A display panel inspection socket according to claim 1, wherein the display panel has a, gate side;

the electrode terminals are provided on the gate side of the display panel;

the contacts of the contact films for the electrode terminals are connected to each other on one end side and the other end side of the contacts for every odd number column and every even number column; and an insulating coating film for coating mutual connecting regions of the contacts are formed on the contact films.

7. A display panel inspection socket according to claim 1, wherein the display panel has a source side;

the electrode terminals are provided on the source side of the display panel; and further comprising connecting portions for connecting the contacts of the respective columns are arranged on the contact films at intervals from each other along the direction of arrangement of the electrode terminals.

8. A display panel inspection socket according to claim 1, wherein the insulating base plate of the display panel is made of a transparent material;

light shielding patterns having different pitches of arrangement from each other are formed on the insulating base plate and the contact films; and the light shielding patterns exhibit a moire stripe pattern which shifts while changing in width with respect to a change of the amount of the positional deviation between the electrode terminals and the contacts when the transparent insulating base plate and the contact films are superposed.

9. A display panel inspection socket according to claim 1, wherein the insulating base plate of the display panel is made of a transparent material;

light shielding patterns having a different pitch of arrangement from that of the electrode terminals are formed on the contact films; and the electrode terminals and the light shielding patterns exhibit a moire stripe pattern which shifts while changing in width with respect to the change of the amount of positional deviation between the electrode terminals and the contacts when the transparent insulating base plate and the contact films are superposed.

10. A display panel inspection socket according to claim 1, wherein the clip member can further retract from the releasing position to a retracting position on an opposite side to the pressing position;

a flexible shutter interposed between the clip member and the display panel when the clip member presses the display panel is provided on the supporting plate;

the shutter can move from an opening position at which the front end thereof opens the display panel mounting region by the biasing force of a spring means to a covering position at which the front end covers the top of the display panel;

a fitting portion which is fitted with the engagement portion of the shutter when the one side of the clip member retracts from the pressing position to the releasing position is provided on the clip member; and the fitting portion moves the shutter from the covering position to the opening position against the biasing force of the spring means when the clip member further retracts from the releasing position to the retracting position.

11. A display panel inspection socket according to claim 10, wherein the supporting plate is provided with projecting guides which can abut against the bottom surface of the front end of the clip member and space the clip member away from the top surface of the contact films when the clip member moves between the releasing position and the retracting position.

12. A display panel inspection socket according to claim 11, wherein the supporting has a top surface which has almost the same height as the top surface of the display panel at the front end in close contact with the side of the display panel to be mounted on the contact films and the top surface of the supporting plate is inclined downward more gently from the vicinity of the front end of the supporting plate toward the front end.

13. A display panel inspection socket according to claim 10, wherein a lead pattern connected to the contacts is formed on the top surface of each contact film;

the top surface of a flexible printed circuit board on the top surface of which a wiring pattern is formed is superposed on the bottom surface of the base end of each contact film;

small holes are made in each contact film at the position where the lead pattern on each contact film and the wiring pattern on the flexible printed circuit board are superposed; and the lead pattern on each contact film and the wiring pattern on the flexible printed circuit board are electrically connected by an electrically conductive binder provided so as to fill the small holes.

14. A display panel inspection socket according to claim 10, wherein the clip member comprises a damper made of metal having a lateral U-shaped cross-section and having a spring property mounted on the socket body so as to vertically clip the socket body and the display panel and a sliding piece made of plastic which is attached to the bottom surface of the front end of an upper piece over almost the entire length of the upper piece of the clamper and brought into sliding-contact with the top surface of the shutter.

15. A display panel inspection socket according to claim 10, wherein the clip member has a damper made of metal having a lateral U-shaped cross-section having a spring property mounted on the socket body so as to vertically grip the display panel and the socket body and a slit extending in a direction orthogonal to the direction of arrangement of the electrode terminals of the display panel is formed in the clamper.

16. A display panel inspection socket according to claim 15, wherein the slits are formed in the upper pieces of the clampers away from the front ends of the upper pieces of the clampers.

17. A display panel inspection socket according to claim 15 or 16, wherein the clip member further has a sliding piece made of plastic which is attached to the bottom surface of the front end of the upper piece of the damper and brought into sliding-contact with the top surface of the shutter.

18. A display panel inspection socket according to claim 15 or 16, wherein the sliding contact portion which is brought into sliding contact with the top surface of the shutter is formed by bending downward the front end of the upper piece of the clamper;

the shutter is made of a metal plate; and a coating of resin is applied to either of the top surface of the shutter or the sliding contact portion of the clamper.

* * * * *